(12) United States Patent
Ledentsov et al.

(10) Patent No.: US 8,290,016 B2
(45) Date of Patent: *Oct. 16, 2012

(54) OPTOELECTRIC DEVICE FOR HIGH-SPEED DATA TRANSFER WITH ELECTROOPTICALLY TUNABLE STOPBAND EDGE OF A BRAGG-REFLECTOR

(75) Inventors: Nikolai Ledentsov, Berlin (DE); Vitaly Shchukin, Berlin (DE)

(73) Assignee: Connector Optics, St. Petersburg (RU)

( * ) Notice: Subject to any disclaimer, the term of this patent is extended or adjusted under 35 U.S.C. 154(b) by 0 days.

This patent is subject to a terminal disclaimer.

(21) Appl. No.: 12/509,775

(22) Filed: Jul. 27, 2009

(65) Prior Publication Data

US 2009/0296754 A1    Dec. 3, 2009

Related U.S. Application Data

(62) Division of application No. 11/453,979, filed on Jun. 16, 2006, now Pat. No. 7,593,436.

(51) Int. Cl.
*H01S 3/11* (2006.01)
*H01S 5/183* (2006.01)

(52) U.S. Cl. .................. 372/50.124; 372/10; 372/12

(58) Field of Classification Search ............. 398/186, 398/187; 372/50.21, 20, 50.124, 10, 12
See application file for complete search history.

(56) References Cited

U.S. PATENT DOCUMENTS

| | | | |
|---|---|---|---|
| 4,805,235 A | 2/1989 | Henmi | |
| 4,858,240 A * | 8/1989 | Pohler et al. | ............ 372/10 |
| 5,072,272 A | 12/1991 | Omura | |
| 5,574,738 A | 11/1996 | Morgan | |
| 6,091,754 A | 7/2000 | Jiang et al. | |
| 6,215,805 B1 * | 4/2001 | Sartorius et al. | ............ 372/50.1 |

(Continued)

OTHER PUBLICATIONS

Fischer, et al., "Coupled resonator vertical-cavity laser diode", Applied Physics Letters, journal, Nov. 8, 1999, pp. 3020-3022, vol. 75, No. 19, Center for Compound Semiconductor Science and Technology, Sandia National Labs, Albuquerque, New Mexico 87185.

(Continued)

*Primary Examiner* — Patrick Stafford
*Assistant Examiner* — Michael Carter
(74) *Attorney, Agent, or Firm* — Laurence A. Greenberg; Werner H. Stemer; Ralph E. Locher

(57) ABSTRACT

A device contains at least one wavelength-tunable multilayer interference reflector controlled by an applied voltage and at least one cavity. The stopband edge wavelength of the wavelength-tunable multilayer interference reflector is preferably electrooptically tuned using the quantum confined Stark effect in the vicinity of the cavity mode (or a composite cavity mode), resulting in a modulated transmittance of the multilayer interference reflector. A light-emitting medium is preferably introduced in the cavity or in one of the cavities permitting the optoelectronic device to work as an intensity-modulated light-emitting diode or diode laser by applying an injection current. The device preferably contains at least three electric contacts to apply forward or reverse bias and may operate as a vertical cavity surface-emitting light emitter or modulator or as an edge-emitting light emitter or modulator. Using a multilayer interference reflector containing tunable section allows also obtaining a wavelength-tunable laser or a wavelength-tunable resonant cavity photodetector in the case where the optical field profile in the active cavity or cavities is affected by the stopband wavelength shift. Adding additional modulator sections enables applications in semiconductor optical amplifiers, frequency converters or lock-in optical amplifiers.

16 Claims, 14 Drawing Sheets

U.S. PATENT DOCUMENTS

| | | |
|---|---|---|
| 6,285,704 B1 | 9/2001 | Kullander-Sjoberg et al. |
| 6,396,632 B1 | 5/2002 | Liu et al. |
| 6,611,539 B2 | 8/2003 | Ledentsov et al. |
| 6,643,309 B1 | 11/2003 | Gotoda |
| 6,828,168 B2 * | 12/2004 | Kapon et al. .................... 438/22 |
| 6,865,214 B2 | 3/2005 | Kim |
| 2003/0206741 A1 | 11/2003 | Ledentsov et al. |
| 2004/0008747 A1 | 1/2004 | Nakayama et al. |
| 2005/0068541 A1 | 3/2005 | Gunning et al. |
| 2005/0271092 A1 | 12/2005 | Ledentsov et al. |
| 2006/0280511 A1 | 12/2006 | Futami |

OTHER PUBLICATIONS

Wilmsen, et al., "Vertical-Cavity-Surface-Emitting-Lasers: Design, Fabrication, Characterization, and Applications", book, 1999, chapters 2 and 5, Cambridge University Press, Cambridge, UK.

"Bragg Mirrors", online, Encyclopedia of Laser Physics and Technology, http://www.rp-photonics.com/bragg_mirrors.html.

"Distributed Bragg reflector", online, http://en.wikipedia.org/wiki/Distributed_Bragg_reflector.

\* cited by examiner (a) Second Bragg Reflector is switched to a non-transparent state (b)

(c) Second Bragg Reflector is switched to a transparent state (d)

OPTOELECTRIC DEVICE FOR HIGH-SPEED DATA TRANSFER WITH ELECTROOPTICALLY TUNABLE STOPBAND EDGE OF A BRAGG-REFLECTOR

CROSS-REFERENCE TO RELATED APPLICATION

This application is a divisional of patent application Ser. No. 11/453,979, filed Jun. 16, 2006; the prior application is herewith incorporated by reference in its entirety.

BACKGROUND OF THE INVENTION

1. Field of the Invention

The invention pertains to the field of semiconductor devices. More particularly, the invention pertains to ultra-high-speed optoelectronic devices, such as light-emitting diodes and laser diodes.

2. Description of Related Art

High-speed optoelectronic devices are broadly applied in modern datacommunication and telecommunication systems.

These devices can be separated into two categories: those directly modulated by injection of current into the gain region, and those externally modulated. Direct modulation offers the advantage of low cost but requires very high photon densities in the resonant cavity. For, example, edge-emitting lasers operating at 40 Gb/s have been reported.

The intrinsic speed is defined by the so-called "−3 dB" bandwidth, which is roughly proportional to the relaxation-oscillation frequency:

$$f_r = \frac{1}{2\pi}\sqrt{\frac{g_n p_0}{\tau_p}}, \quad (1)$$

where $g_n$ denotes the differential gain, $p_0$ is the average photon density in the cavity, and $\tau_p$ is the cavity photon lifetime.

A first way to increase the laser bandwidth is to increase the pump current density thereby increasing the photon population of the cavity, for example, by reducing the surface area of the device for the same total current. Under pulsed excitation relaxation, an oscillation frequency as high as 70 GHz has been demonstrated in a pulsed regime at room temperature under applied voltage of 15 volts. The problem for direct modulation is the overheating of the active region in the continuous wave regime and the related saturation of the differential gain with current and the related saturation of the relaxation oscillation frequency. Another challenge for direct modulation is degradation stability of the device. At the very high current densities the degradation rate may be unacceptably high.

Another big problem of direct modulation is a high differential capacitance of the device under forward bias. The injected carriers reduce the effective thickness of the undoped layer in the p-n-junction and increase the capacitance. Thus, realization of ultrahigh-speed devices is challenging also in this case.

In contrast, indirect modulation using elecroptic effects under reverse bias has long been known in ultrahigh-speed transmitters operating at 40-60 Gb/s. For example, a 40-Gb/s open eye diagram of the electroabsorption modulator after 700-km transmission has been demonstrated.

Once the need for direct modulation is abandoned, ultra-high-speed signal management becomes much easier. 60-100 GHz pin diode photodetectors using large mesa devices as well as other devices are known in the art.

U.S. Pat. No. 6,285,704, "FIELD MODULATED VERTICAL CAVITY SURFACE-EMITTING LASER WITH INTERNAL OPTICAL PUMPING", issued Sep. 4, 2001, proposes a photopumped VCSEL. This VCSEL may be modulated by using an external electrical field applied perpendicular to the active layer, employing the Stark-effect to deliberately change the bandgap of the active layer and hence move the emission wavelength into and out of resonance with the optical cavity formed between the top and bottom mirrors. The optical output is therefore modulated by the electrical field and not by injected carriers. However, as the active region of the device is under a continuous population inversion condition, applying a reverse bias to change the bandgap may cause dramatic photocurrent, depleting the photo-pumped active region.

U.S. Pat. No. 5,574,738, "MULTI-GIGAHERTZ FREQUENCY-MODULATED VERTICAL-CAVITY SURFACE-EMITTING LASER", issued Nov. 12, 1996, discloses a saturable absorber contained within the VCSEL's distributed Bragg reflector, which may itself be adjusted during fabrication or in operation. Under controllable operating conditions, the saturable absorber, strategically sized and placed, forces the VCSEL to self-pulsate (in the GHz-regime) at rates related to the local intensity, absorption, lifetime, and carrier density of the saturable absorber. In one of the embodiments, efficiency of the saturable absorber may be controlled by the quantum-confined Stark effect. Mode-locked operation, however, is usually very sensitive to the conditions of the device operation and exists only in a relatively narrow range of carefully-optimized conditions.

U.S. Pat. No. 6,396,083, entitled "OPTICAL SEMICONDUCTOR DEVICE WITH RESONANT CAVITY TUNABLE IN WAVELENGTH, APPLICATION TO MODULATION OF LIGHT INTENSITY", issued May 28, 2002, discloses a device including a resonant cavity. The resonant cavity is delimited by two mirrors and at least one superlattice that is placed in the cavity and is formed from piezoelectric semiconducting layers. The device also includes means of injecting charge carriers into the super-lattice. One disadvantage of this device is the necessity of using piezoelectric materials. The piezoelectric semiconducting layers are epitaxially grown on a $Cd_{0.88}Zn_{0.12}Te$ substrate and include a pattern composed of a layer of $Cd_{0.91}Mg_{0.09}Te$ and a layer $Cd_{0.88}Zn_{0.22}Te$, each 10 nm thick. This pattern is repeated about a hundred times. The device in this patent is a two-terminal device. The separation of carriers in a piezoelectric superlattice causes long depopulation times. Wavelength modulation and intensity modulation are always interconnected in this patent.

An electrooptic modulator based on the quantum confined Stark effect (QCSE) in a VCSEL was disclosed in U.S. Pat. No. 6,611,539, "WAVELENGTH-TUNABLE VERTICAL CAVITY SURFACE-EMITTING LASER AND METHOD OF MAKING SAME" issued Aug. 26, 2003, by the inventors of the present invention and herein incorporated by reference. The device includes active media suitable for providing gain and enabling laser action of the device, and a position-dependent electrooptic modulator region. Applying the voltage to the modulator region results in a wavelength shift of the lasing wavelength. The absorption in the modulator region remains small. The device is especially applicable for ultrahigh-speed data transfer using wavelength-modulation.

U.S. Patent Publication 2003/0206741, entitled "INTELLIGENT WAVELENGTH DIVISION MULTIPLEXING SYSTEMS BASED ON ARRAYS OF WAVELENGTH TUNABLE LASERS AND WAVELENGTH TUNABLE RESONANT PHOTODETECTORS", published Nov. 6, 2003, by the inventors of the present invention and herein incorporated by reference, disclosed high-bit rate data transfer systems based on wavelength-to-intensity modulation conversion. In this approach, a wavelength-tunable VCSEL operates in concert with a wavelength-selective photodetector on the receiver side. Modulation of the VCSEL wavelength transforms into the photodetector current modulation.

U.S. Patent Publication 2005/0271092, entitled "ELECTROOPTICALLY WAVELENGTH-TUNABLE RESONANT CAVITY OPTOELECTRONIC DEVICE FOR HIGH-SPEED DATA TRANSFER" published Dec. 8, 2005, by the inventors of the present invention and herein incorporated by reference, disclosed high-bit rate data transfer system based on a device, which contains at least one wavelength-tunable element controlled by an applied voltage and at least two resonant cavities. The resonant wavelength of the tunable element is preferably elecrooptically tuned using the quantum confined Stark effect around the resonant wavelength of the other cavity or cavities, resulting in a modulated transmittance of the system. A light-emitting medium is preferably introduced in one of the cavities permitting the optoelectronic device to work as an intensity-modulated light-emitting diode or diode laser by applying an injection current. The device preferably contains at least three electric contacts to apply forward or reverse bias and may operate as a vertical cavity surface-emitting light emitter or modulator or as a tilted cavity light emitter or modulator. The problem of this device, however, is need in very strict growth tolerances, as the device operation is extremely sensitive to the spectral position of the cavity mode of the wavelength-tunable resonating cavity with respect to the VCSEL cavity mode. Assuming the growth rate non-uniformity for different materials used in the modulator and the VCSEL sections, there is unavoidable non-uniformity in device performance across the wafer. Another disadvantage is the fact that the output power is a non-monotonous function of the applied voltage. The device has low power in the absence of the applied voltage (the cavities are out of resonance), the power is high at a certain voltage (the cavities are in resonance), and the power is again low at even higher bias voltages (the cavities are out of resonance).

As the standard telecom and datacom devices operate only in the "on-off" mode, this non-monotonous characteristic is highly undesirable.

Thus, there is a need in the art for a robust ultrafast way to modulate the intensity of the device.

SUMMARY OF THE INVENTION

A device contains at least one wavelength-tunable multilayer interference reflector controlled by an applied voltage and at least one cavity. The stopband edge wavelength of the wavelength-tunable multilayer interference reflector is preferably electrooptically tuned using the quantum confined Stark effect in the vicinity of the cavity mode (or a composite cavity mode), resulting in a modulated transmittance of the multilayer interference reflector. A light-emitting medium is preferably introduced in the cavity or in one of the cavities permitting the optoelectronic device to work as an intensity-modulated light-emitting diode or diode laser by applying an injection current. The device preferably contains at least three electric contacts to apply forward or reverse bias and may operate as a vertical cavity surface-emitting light emitter or modulator or as an edge-emitting light emitter or modulator. Using a multilayer interference reflector containing tunable section allows also obtaining a wavelength-tunable laser or a wavelength-tunable resonant cavity photodetector in the case where the optical field profile in the active cavity or cavities is affected by the stopband wavelength shift. Adding additional modulator sections enables applications in semiconductor optical amplifiers, frequency converters or lock-in optical amplifiers.

BRIEF DESCRIPTION OF THE DRAWINGS

FIG. 11(a) shows schematically the device wherein the second Bragg reflector is switched to a non-transparent state.

FIG. 11(b) shows schematically the electric field strength in the resonant optical mode of the device, wherein the second DBR is switched to a non-transparent state.

FIG. 11(c) shows schematically the device wherein the second Bragg reflector is switched to a transparent state.

FIG. 11(d) shows schematically the electric field strength in the resonant optical mode of the device, wherein the second DBR is switched to a transparent state.

DETAILED DESCRIPTION OF THE INVENTION

The present invention provides an ultrafast way to modulate the intensity of an optoelectronic device.

Figure 1:
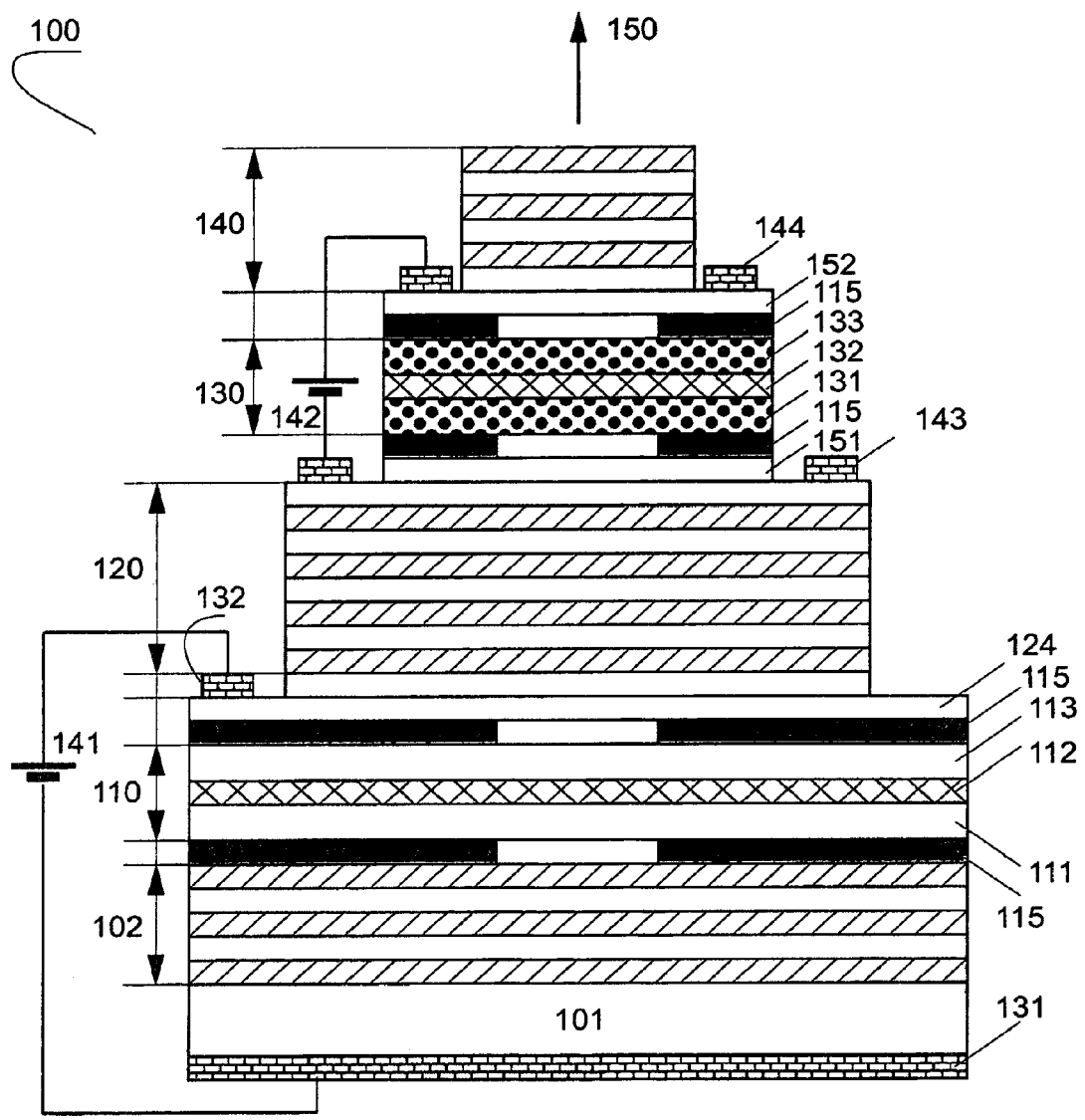
FIG. 1 shows a schematic diagram of a prior art electronically intensity-modulated vertical cavity surface-emitting laser including a wavelength-tunable cavity with a modulating element, and a cavity with light generating element.

FIG. 1 shows a schematic diagram of a prior art electronically intensity-modulated vertical cavity surface-emitting laser, invented by the inventor of the present invention. The device (100) includes a wavelength-tunable cavity with a modulating element and a cavity with light generating element. The device (100) includes a substrate (101), which is preferably n-doped, a first distributed Bragg reflector (102), which is preferably n-doped, a light generating element (110), a first current spreading p-layer (124), a second distributed Bragg reflector (120), which is preferably undoped, a second current spreading p-layer (151), a filter element (130), into which a modulator region is introduced, a first current spreading n-layer (152), and a third distributed Bragg reflector (140), which is preferably undoped. The filter element (130) includes a weakly p-doped or an undoped layer (131), a modulator region (132), and a weakly n-doped or undoped layer (133). A forward bias (141) is applied to the light generating element (110) via the n-contact (131) and the p-contact (132). A reverse bias (142) is applied to the modulator region (132) via the p-contact (143) and the n-contact (144). Current apertures (115) are introduced between the first distributed Bragg reflector (102) and the light generating element (110), between the light generating element (110) and the first current spreading p-layer (124), between the second current spreading p-layer (151) and the filter element (130), and between the filter element (130) and the current spreading n-layer (152). Laser light (150) comes out through the third distributed Bragg reflector (140).

The part of the device, including the substrate (101), the first distributed Bragg reflector (102), the light generating element (110), and the second distributed Bragg reflector (120) is a vertical cavity surface-emitting laser. In addition, the device includes a filter element (130).

The substrate (101) is preferably formed from any III-V semiconductor material or III-V semiconductor alloy, e.g. GaAs, InP, GaSb. GaAs or InP are preferably used depending on the desired emitted wavelength of laser radiation. Alternatively, sapphire, SiC or Si(111) may be used as substrates for GaN-based lasers, i.e. laser structures the layers of which are formed of GaN, AlN, InN, or alloys of these materials. The substrate (101) is doped by an n-type, or donor impurity. Possible donor impurities include, but are not limited to, S, Se, Te, and amphoteric impurities like Si, Ge, Sn where the latter are introduced under such technological conditions that they are incorporated predominantly into the cation sublattice and serve as donor impurities. Any substrate orientation including, but not limited to, (100), (110), (111), or a high Miller index substrate, may be used.

The first distributed Bragg reflector (102) preferably includes a periodic structure of layers, transparent for the generated laser light, having alternating high and low refractive indices and is n-doped. The layers are formed of the materials preferably lattice-matched or nearly lattice-matched to the substrate. In a GaAs-based device, the layers of the first distributed Bragg reflector are preferably formed of GaAs and GaAlAs, or of layers of GaAlAs with alternating Al content.

The light generating element (110) preferably includes an undoped or a weakly n-doped layer (111), an active region (112), and an undoped or weakly p-doped layer (113). Layers are formed of materials, lattice-matched or nearly lattice-matched to the substrate, and transparent to the generated laser light.

The active region (112) is formed of any insertion or combinations of insertions, including a double heterostructure, a quantum well, an array of quantum wires, and arrays of quantum dots, or any combination thereof. The active region generates light, when a forward bias (141) is applied.

For structures grown on a GaAs substrate, materials for the active region include, but are not limited to, GaAs, InGaAs, GaAsSb, GaAsP, GaAlAs, InGaAsN, and InGaAsNSb. For structures grown on sapphire, SiC, or Si(111), materials for the active region include, but are not limited to, InGaN, InGaAlN, and InGaAlNAs. For structures grown on InP, materials for the active region include, but are not limited to, InGaAs, InGaAlAs, InGaAsSb, InGaAsP, and InGaAsN.

A forward bias (141) is applied via a first contact (131) (an n-contact) and a second contact (132) (a p-contact). The contacts and are preferably formed from the multi-layered metal structures. The n-contact (131) is preferably formed from the structures including, but not limited to, the structure Ni—Au—Ge. The p-contact (132) is preferably formed from structures including, but not limited to, the structure Ti—Pt—Au.

The p-contact (132) is preferably mounted on a current spreading p-layer (124). The current spreading p-layer (124) is preferably formed of a material lattice-matched or nearly lattice-matched to the substrate, transparent to the generated laser light and p-doped, i.e. doped by an acceptor impurity. Possible acceptor impurities include, but are not limited to, Be, Mg, Zn, Cd, Pb, Mn and amphoteric impurities like Si, Ge, Sn where the latter are introduced under such technological conditions that they are incorporated predominantly into the anion sublattice and serve as acceptor impurities.

The modulating element (130) includes a weakly p-doped or an undoped layer (131), a modulator cavity region (132), and a weakly n-doped or an undoped layer (133). Layers are preferably formed of any material, lattice-matched or nearly lattice-matched to the substrate and transparent to the generated laser light.

The modulator region includes one or more quantum wells, one or more layers of quantum wires or quantum dots, or any combination thereof. In the particular embodiment of FIG. 1, the modulator operates when a reverse bias (142) is applied.

Figure 2:
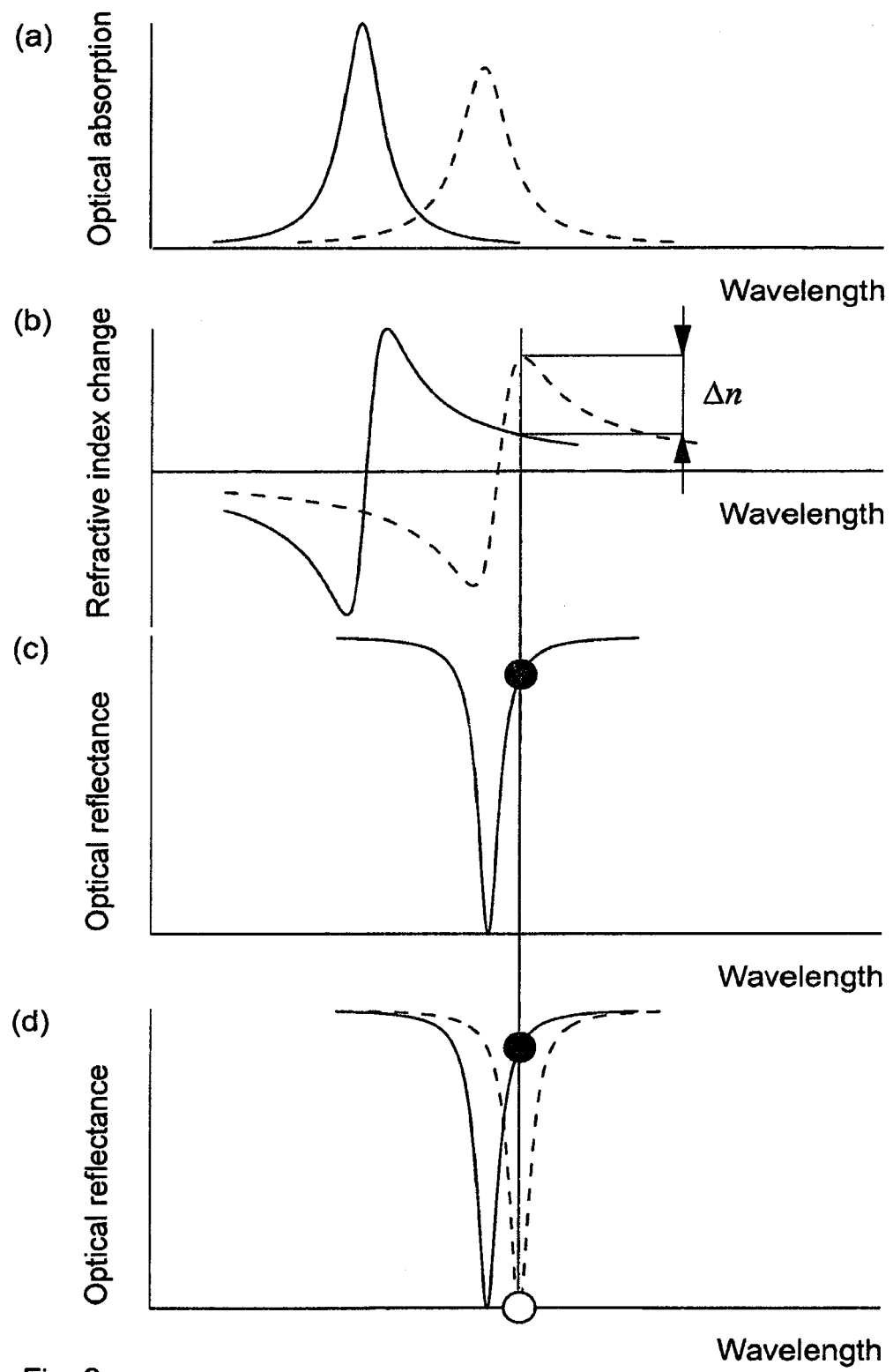
FIG. 2(a) shows schematically optical absorption spectra of the resonantly absorbing element, incorporated in the modulator cavity of the prior art device under zero bias and under reverse bias. The quantum confined Stark effect causes red shift of the absorption maximum and a broadening of the peak.
FIG. 2(b) shows schematically refractive index modulation spectra of the resonantly absorbing element, incorporated in the modulator cavity of the prior art device under zero bias and under reverse bias. There is an enhancement of the refractive index at certain wavelength (dashed vertical line), which may be a lasing wavelength of the vertical-cavity surface-emitting laser section of the device.
FIG. 2(c) shows a reflectivity dip of the modulator cavity under zero bias.
FIG. 2(d) shows a reflectivity dip of the modulator cavity under reverse bias. Note that the transparency of the system laser-modulator is increased. Further increase in voltage will result, however, in reduced transparency at the same wavelength.

FIG. 2 describes schematically the functioning of the modulator element (130) of the device (100) in FIG. 1. The operation of the modulator is based on the quantum confined Stark effect. By varying the bias, the electric field applied to the modulator is varied. Then the position of the optical absorption peak is shifted, due to the Stark effect as it is shown in FIG. 2(a). Due to Kramers-Kronig relationship between the real and imaginary parts of the dielectric function of the medium, the shift of the absorption peak results in a modulation of the refractive index of the modulator, as it is shown in FIG. 2(b). The latter leads to a shift of the resonant wavelength of the vertical cavity mode reflectivity spectrum from the position depicted in FIG. 2(c) to the position in FIG. 2(d), dashed line. This shift results in matching of the modulator transparency wavelength with the wavelength of the generated laser light and, thus, in a higher output power of the device.

In another embodiment, the modulator region operates under a forward bias. Applying a forward bias results in the exciton bleaching effect, which further leads to a change in refractive index of the modulator region.

Figure 3:
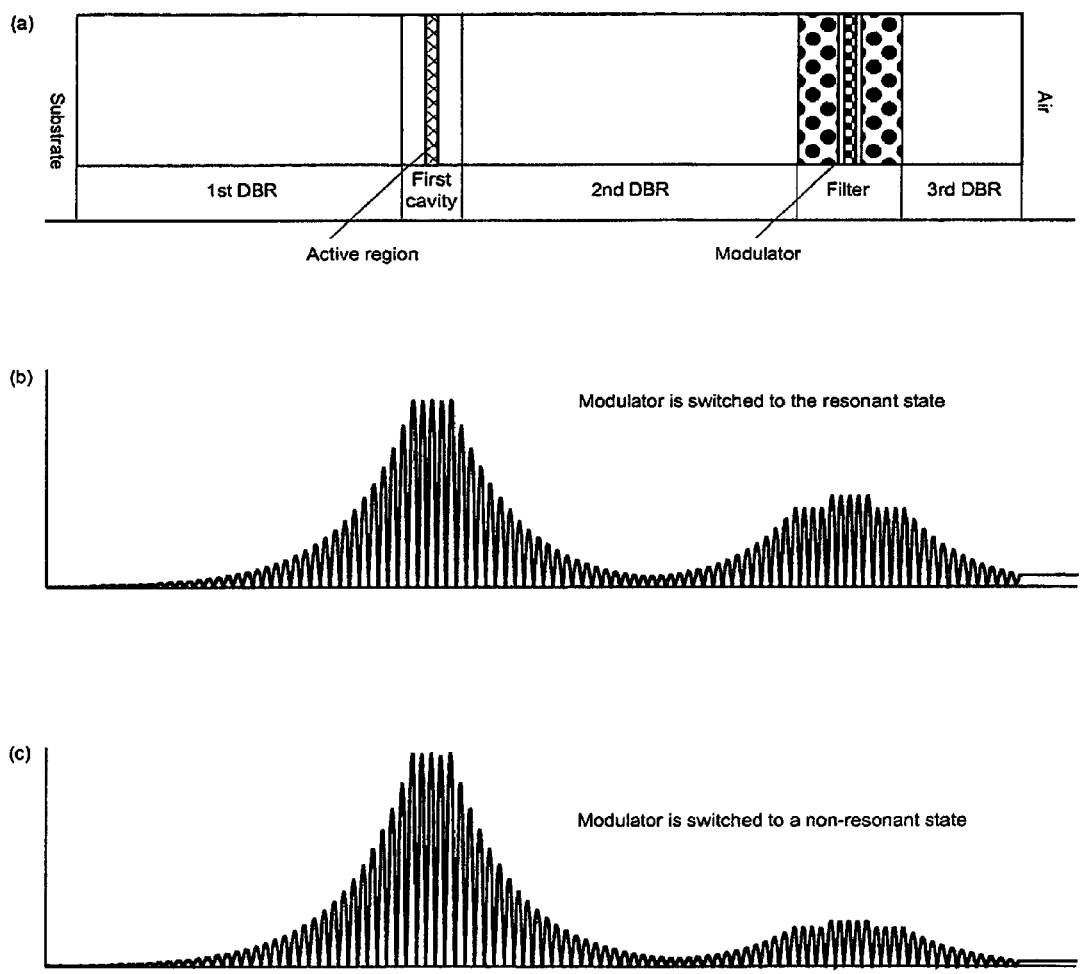
FIG. 3(a) shows a schematic diagram of the device of FIG. 1.
FIG. 3(b) shows a schematic diagram of the absolute value of the electric field strength profile of the laser optical mode of the device of FIG. 1 where the modulator is in the resonant state.
FIG. 3(c) shows a schematic diagram of the absolute value of the electric field strength profile of the laser optical mode of the device of FIG. 1 where the modulator is in a non-resonant state.

FIG. 3 illustrates the principles of the operation of the electronically wavelength tunable vertical cavity surface-emitting laser of FIG. 1. FIG. 3(a) shows schematically the device of FIG. 1 in a simple form, showing only key elements. The elements shown include the substrate, the first distributed Bragg reflector, the first cavity (which includes the active region), the second distributed Bragg reflector, the electrooptically-modulated filter section, and the third distributed Bragg reflector.

FIG. 3(b) shows the spatial profile of the resonant optical mode of the device when the modulator is switched to the resonant state. FIG. 3(b) plots the absolute value of the electric field strength in the optical mode. In the resonant state, the laser generates the laser light at a wavelength, which corresponds to the resonant wavelength of the filter. Therefore the resonant optical mode of the laser is a coupled mode having high intensity in both the first cavity and in the filter. Consequently, the light output power proportional to the field intensity in the air is high.

FIG. 3(c) shows the spatial profile of the resonant optical mode of the device when the modulator is switched to a non-resonant state. FIG. 3(c) plots the absolute value of the electric field strength in the optical mode. In any non-resonant state, the laser generates the laser light at a wavelength other than the resonant wavelength of the filter. Therefore the optical mode of the laser at the non-resonant wavelengths is a mode having a high intensity in the first cavity and a low intensity in the filter. Consequently, the light output power proportional to the field intensity in the air is low.

Alternating a bias voltage applied to the modulator switches the device between the resonant state and some selected non-resonant state. The output light power alternates between a high intensity and a low intensity accordingly.

Figure 4:
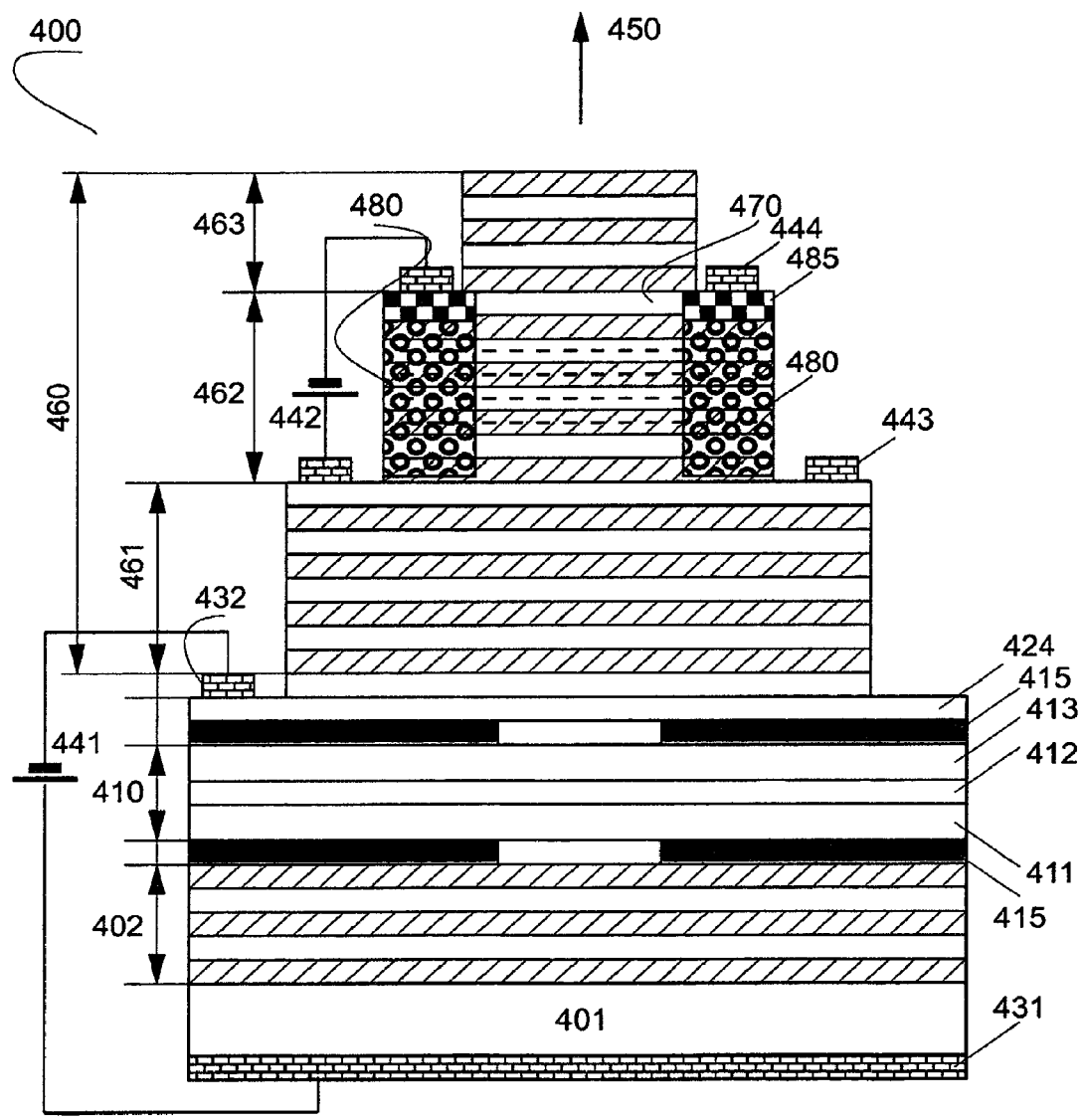
FIG. 4 shows a schematic diagram of an intensity-modulated surface-emitting laser including a light generating element and a tunable stopband distributed Bragg reflector, where a modulator is placed in the distributed Bragg reflector. The light emission can be realized from both the surface and the substrate side. The vertical alignment of the tunable stopband reflector and the laser cavity can be also reversed. Oxide-confined apertures can be used. Proton bombardment or ion implantation of the top modulator mesa can be used to ensure very low capacitance of the modulator section.

FIG. 4 shows a schematic diagram of an electrooptically-modulated vertical cavity surface-emitting laser according to a preferred embodiment of the present invention. The modulator element is integrated with the multilayer interference reflector element, for example, distributed Bragg reflector (DBR). By varying a voltage applied to a modulator, its refractive index changes. The stopband of the DBR then shifts towards the wavelength of the generated laser light, and prevents it's penetration through the top DBR structure. Thus, the output intensity of the device is modulated. Thus the device operates as an electronically wavelength tunable DBR stopband edge vertical cavity surface-emitting laser providing output laser light modulated in intensity.

The device (400) of the embodiment shown in FIG. 4 is grown epitaxially preferably on a p-doped substrate (401) and comprises a first, or bottom DBR (402), which is preferably p-doped, the light generating element (410), and a second, or top DBR (460). The top DBR (460) preferably comprises a first part (461), which is preferably n-doped, a second part (462), which is preferably undoped, and a third part (463), which is preferably p-doped. The light generating element (410) preferably includes a weakly p-doped or an undoped layer (411), an active region (412), a weakly n-doped or an undoped layer (413).

The active region (412) is formed of any insertion or combinations of insertions, including a double heterostructure, a quantum well, an array of quantum wires, and arrays of quantum dots, or any combination thereof. The active region generates light, when a forward bias (441) is applied via the p-contact (431) and the n-contact (432). In this embodiment, a current spreading n-layer is formed (424) between the light generating element (410) and the top DBR (460). Current apertures (415) are introduced between the first DBR (402) and the light generating element (410), and between the light generating element (410) and the current spreading layer (424).

The second part (462) of the top DBR operates as a modulator element. A reverse bias (442) is applied to the undoped part of the DBR via the n-contact (443) and the p-contact (444). The modulator element preferably includes a single or multiple quantum insertions (470), which can be a single or multiple quantum wells, a single or multiple layers of quantum wires, a single or multiple layers of quantum dots, or any combination thereof.

In order to provide high-frequency operation of the device (400), certain measures are preferably undertaken to reduce parasitic capacitance of the modulator region. The region underneath the n-contact (444) is preferably subject to proton bombardment, which results in the formation of a region (480) with a high concentration of defects and low conductivity. Thus, the region (480) formed of initially n-doped or p-doped regions, will behave as a region of intrinsic, i.e. semi-insulating semiconductor. In order to provide a possibility to apply the bias (442) to the quantum insertions (470) within the modulator element, diffusion of Zn is preferably performed to the region (485) underneath the p-contact (444). Due to the diffusion of Zn, a part of semi-insulating region transforms in a p-doped highly conducting region, allowing to apply bias from the p-contact (444) to the quantum insertions (470).

In one another embodiment of the present invention, the top DBR (460) does not comprise a third part (463), and the contacts (444) are mounted on the top exit surface of the device.

In yet another embodiment of the present invention, the top DBR (460) does not comprise a first part (461). And in one another embodiment of the present invention, the contacts (432) and (443) are combined to a single n-contact, and the device, instead of a four-contact design of FIG. 4, is a three-contact device.

And in one another embodiment of the present invention, the bias (442) is applied to the entire top DBR (460).

The modulator element (462) of FIG. 4 contains an n-i-p structure. In another embodiment of the present invention, the modulator element contains an n-i-n structure. In yet another embodiment of the present invention, the modulator element contains a p-i-p structure. Here "i" denotes "intrinsic" or weakly doped region.

Figure 5:
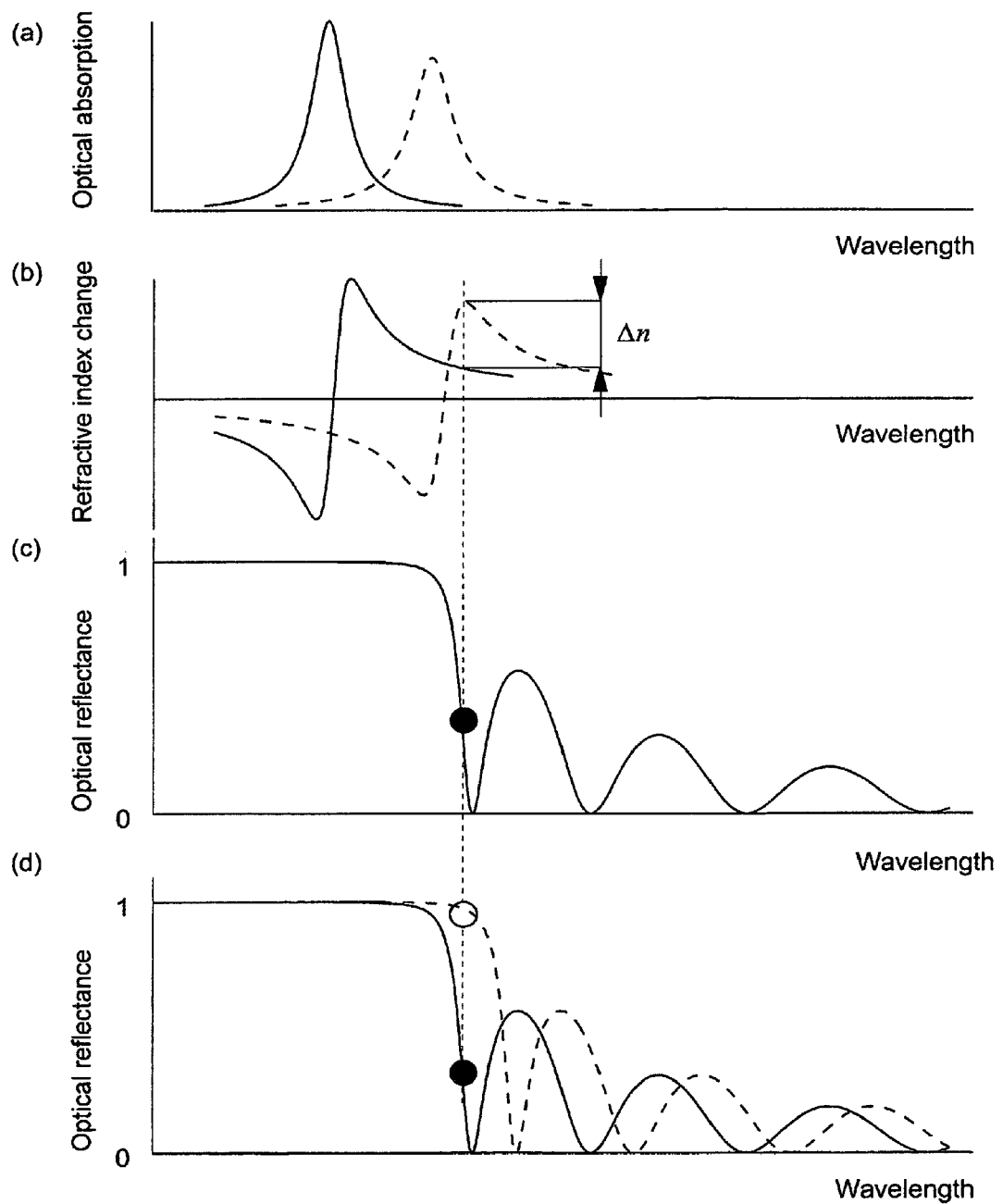
FIG. 5(a) shows schematically optical absorption spectra of the resonantly absorbing element, incorporated in the modulator cavity of the device under zero bias and under reverse bias. The quantum confined Starke effects causes red shift of the absorption maximum and a broadening of the peak.
FIG. 5(b) shows schematically refractive index modulation spectra of the resonantly absorbing element, incorporated in the modulator cavity of the device under zero bias and under reverse bias. There is an enhancement of the refractive index at certain wavelength (dashed vertical line), which may be a lasing wavelength of the vertical-cavity surface-emitting laser section of the device.
FIG. 5(c) shows a reflectivity spectrum of the modulator cavity under zero bias.
FIG. 5(d) shows a reflectivity spectrum of the modulator cavity under reverse bias. Note that the transparency of the system laser-modulator is decreased. Further increase in voltage will result, in further reduced transparency at the same wavelength.

FIG. 5 schematically explains the operation of the device. Under a reverse bias, an electric field applied to the quantum insertions in the modulator region causes a quantum confined Stark effect. The latter results in a shift of the spectral position of the optical absorption peak. Due to Kramers-Kronig relationship between the real and the imaginary parts of the dielectric functions, a change in the absorption spectrum is accompanied by a corresponding variation of the refractive index. The change in the refractive index of the modulator leads to a shift in the stopband edge wavelength of the modulator element. Thus, by applying a different value of the reverse bias, it is possible to shift the stopband edge wavelength of the filter element. This allows the modulator element to turn the device into the closed state with minimum light intensity coming out of the device. The DBR stopband edge may be alternatively placed being red-shifted from the lasing wavelength.

The functionality of the devices of the present invention is based on electrooptical effect, namely on a change in the refractive index when an electric field is applied. If an electric field is applied perpendicularly to the layers, the conduction and the valence bands of the semiconductor device tilt due to the potential of the external field resulting in the shifting of the energy levels. This results in a smaller absorption energy, and the absorption edge shifts to longer wavelengths. The effect in bulk materials is known as the Franz-Keldysh effect (I. Galbraith, B. Ryvkin "Empirical determination of the electroabsorption coefficient in semiconductors", J. Appl. Phys. 74, 4145 (1993)). A change in the absorption coefficient $\Delta\alpha$ (electroabsorption) results also in a refractive index change $\Delta n$ (electrorefraction). The latter can be calculated by Kramers-Kronig transform, (see, e.g., D. S. Chelma et al. "Room Temperature Excitonic Nonlinear Absorption and Refraction in GaAs/AlGaAs Multiple Quantum Well Structures", IEEE Journal of Quantum Electronics, Vol. QE-20 (3), pp. 265-275 (1984)), $$\Delta n(\omega) = \frac{c}{\pi} P \int_0^\infty \frac{\Delta\alpha(\omega')}{\omega'^2 - \omega^2} d\omega'. \qquad (2)$$

where the symbol P indicates that the principal value of the integral has to be evaluated, and c is the velocity of light.

The phenomenon in quantum confined structures like quantum wells, quantum wires or quantum dots is referred to as the Quantum Confined Stark Effect. In realistic electric fields, ranging from zero to a few hundred kV/cm, the electrorefraction is described as a sum of a linear eletrooptical effect (Pockel's effect) and a quadratic electrooptical effect (Kerr effect), (see, e.g. J. E. Zucker, T. L. Hendrickson, and C. A. Burrus, "Electro-optic phase modulation in GaAs/AlGaAs quantum well waveguides", Applied Physics Letters, Vol. 52 (12), pp. 945-947 (1988)).

$$\Delta n = \frac{1}{2} n_0^3 (rF + sF^2), \qquad (3)$$

where F is the electric field strength, $n_0$ is the refractive index in the zero electric field, and r and s are the linear and quadratic electrooptical coefficients.

In GaAs/GaAlAs quantum well structures, the quadratic electrooptical effect dominates at electric fields of about 50 kV/cm (see J. S. Weiner et al., "Quadratic electro-optic effect due to the quantum-confined Stark effect in quantum wells", Applied Physics Letters, Vol. 50 (13), pp. 842-844 (1987) and J. E. Zucker et al. "Quaternary quantum wells for electro-optic intensity and phase modulation at 1.3 and 1.55 μm", Applied Physics Letters, Vol. 54 (1), pp. 10-12 (1989)). Furthermore, the quadratic electrooptical coefficient s in GaInAs/InP, GaInAsP/InP, and GaAs/GaAlAs quantum well structures is inversely proportional to the detuning $\Delta\omega$ between the exciton energy in the zero electric field and the photon energy below the bandgap, at which the refractive index is considered, $$\Delta n = \frac{\eta F^2}{\Delta\omega}. \qquad (4)$$

Here η is the so called figure of merit, which was estimated to be of the order of $3 \times 10^{-5}$ meV cm$^2$ kV$^{-2}$. The behavior (Eq. (4)) had initially been experimentally studied for quantum wells having a width between 6 and 10 nm, and detunings up to 40 meV. The electrooptical effect decreases at larger detuning (from 40 to 140 meV) much faster than given by Eq. (4) (see M. P. Earnshow and D. W. E. Allshop, "Electrooptic Effects in GaAs—AlGaAs Narrow Coupled Quantum Wells", IEEE Journal of Quantum Electronics, Vol. 37 (7), pp. 897-904; ibid. Vol. 37 (8), p. 1103 (2001)).

Although the exciton peak absorption decreases significantly upon applied electric field (see, e.g., L. Chen, K. C. Rajkumar, and A. Madhukar "Optical Absorption and Modulation Behavior of Strained InxGa1-xAs/GaAs (100) (x≦0.25) multiple quantum well structure grown via molecular beam epitaxy", Applied Physics Letters, Vol. 57 (23), pp. 2478-2480 (1990)), the exciton line width increases correspondingly. The integral excition absorption is proportional to the oscillator strength, which can also be roughly estimated to be proportional to the product of the peak absorption by the exciton line width, may either decrease much slower or even remain unchanged.

The exciton oscillator strength in a rather narrow quantum well remains unaffected by an applied electric field if the quantum well width is smaller than one half of the exciton Bohr radius (see Feng et al. "Exciton energies as a function of electric field: Confined quantum Stark effect", Physical Review B, Vol. 48 (3), pp. 1963-1966 (1993)). For InGaAs quantum wells in GaAs, this means quantum wells preferably 7 nm or thinner. The unaffected oscillator strength implies unaffected integral excition absorption. Additionally, there is evidence of an increased electrooptical effect in narrow coupled quantum wells.

While selecting particular quantum wells for the modulator for the present invention, as well as particular values of the detuning and electric field, it is important to take into account electrooptical effects and their theoretical modeling, which are published in the references cited above. These references are hereby incorporated herein by reference.

In a different embodiment of the present invention, the modulator region operates under a forward bias. This causes the exciton bleaching effect that changes the optical absorption peak and thus affects the refractive index of the modulator.

In yet another embodiment of the present invention a resonant cavity light-emitting diode comprises an electrooptically-modulated Bragg reflector. Applying bias to a Bragg reflector or its part, it is possible to modulate intensity of light coming out of the light-emitting diode.

FIG. 5 illustrates the principles of the operation of the electronically wavelength tunable vertical cavity surface-emitting laser of FIG. 4. FIG. 5(a) shows schematically the position of the optical absorption peak being shifted with applied voltage, due to the Stark effect. Due to Kramers-Kronig relationship between the real and imaginary parts of the dielectric function of the medium, the shift of the absorption peak results in a modulation of the refractive index of the modulator, as it is shown in FIG. 2(b). The latter leads to a shift of the stopband edge wavelength of the modulator-DBR section from position depicted in FIG. 5(c) to the position in FIG. 5(d), dashed line. This shift results in suppression of the modulator transparency, and, thus, in a lower output power of the device.

Different embodiments resulting in a shift of the DBR stopband edge are possible. Let the DBR consist of alternating layers having, at zero bias, refractive indices $n_1$ and $n_2$. Then, in one of the embodiments, quantum insertions are selected such that applying of the reverse bias results in an increase of the refractive indices of both layers.

$$\Delta n_1 > 0, \text{ and } \Delta n_2 > 0, \tag{5}$$

which further leads to a shift of the long wavelength stopband edge towards longer wavelengths. In another embodiment, quantum insertions are selected such that, upon an applied reverse bias, indices of the two layers change in opposite directions, and the optical contrast increases, $$\Delta |n_2 - n_1| > 0, \tag{6}$$

which also further leads to a shift of the longwavelength stopband edge towards longer wavelength.

In yet another embodiment of the present invention, light output through the substrate is used. If the top DBR in the non-transparent state has the transparency comparable or lower than the transparency of the bottom DBR, the light output power through the bottom DBR and the substrate will be modulated. Thus, the device may operate in both directions, but the "on" and "off" states will be reversed. Namely, switching the top DBR to the "off" regime may lead to the enhancement of the light output through the bottom DBR, and vice versa.

In one another embodiment of the present invention, the transparency of the bottom DBR is modulated. Light output power through the bottom DBR and the substrate is modulated accordingly.

In yet another embodiment of the present invention, the transparency of the bottom DBR is modulated, and light output through the top DBR is modulated in the reverse manner.

In one another embodiment, the modulator region operates under a forward bias. Applying a forward bias results in an exciton bleaching effect, which further leads to a change in refractive index of the modulator region and the shift of the Bragg reflector stopband is of the opposite side.

Figure 6:
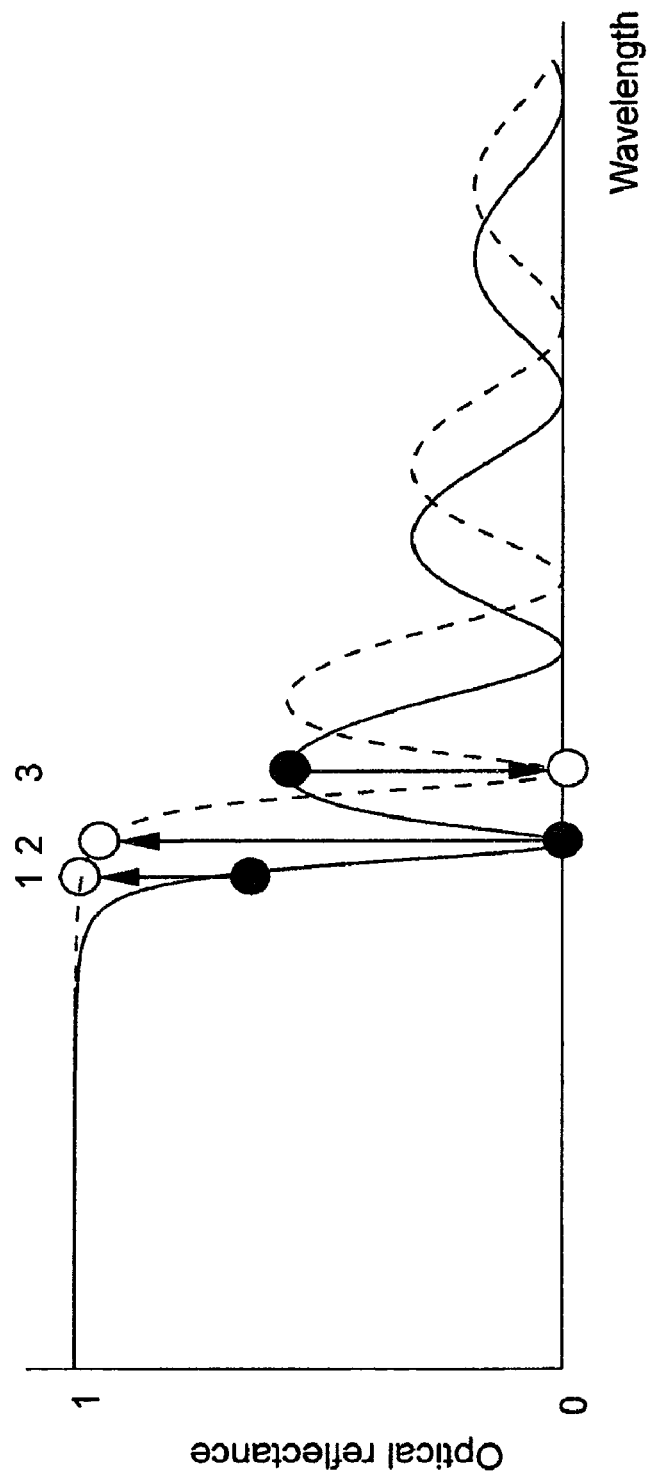
FIG. 6 shows possible positioning of the lasing wavelength as compared to the modulated stopband edge of the multilayer interference reflector.

FIG. 6 illustrates the fact that the transparency of the DBR may be modulated in both directions. Applying the reverse bias to the modulator element results in a shift of the spectral features to longer wavelengths. This is illustrated in FIG. 6, where the optical reflectance of a DBR shown as a solid line is shifted and shown as a dashed line. If the laser wavelength is chosen as $\lambda_1$ or $\lambda_2$, then the shift of the DBR optical reflectance spectrum leads to an increase in DBR reflectivity, the DBR becoming less transparent. If the laser wavelength is chosen as $\lambda_3$, the shift of the DBR optical reflectance spectrum leads to a decrease in DBR reflectivity, the DBR becoming more transparent.

Figure 7:
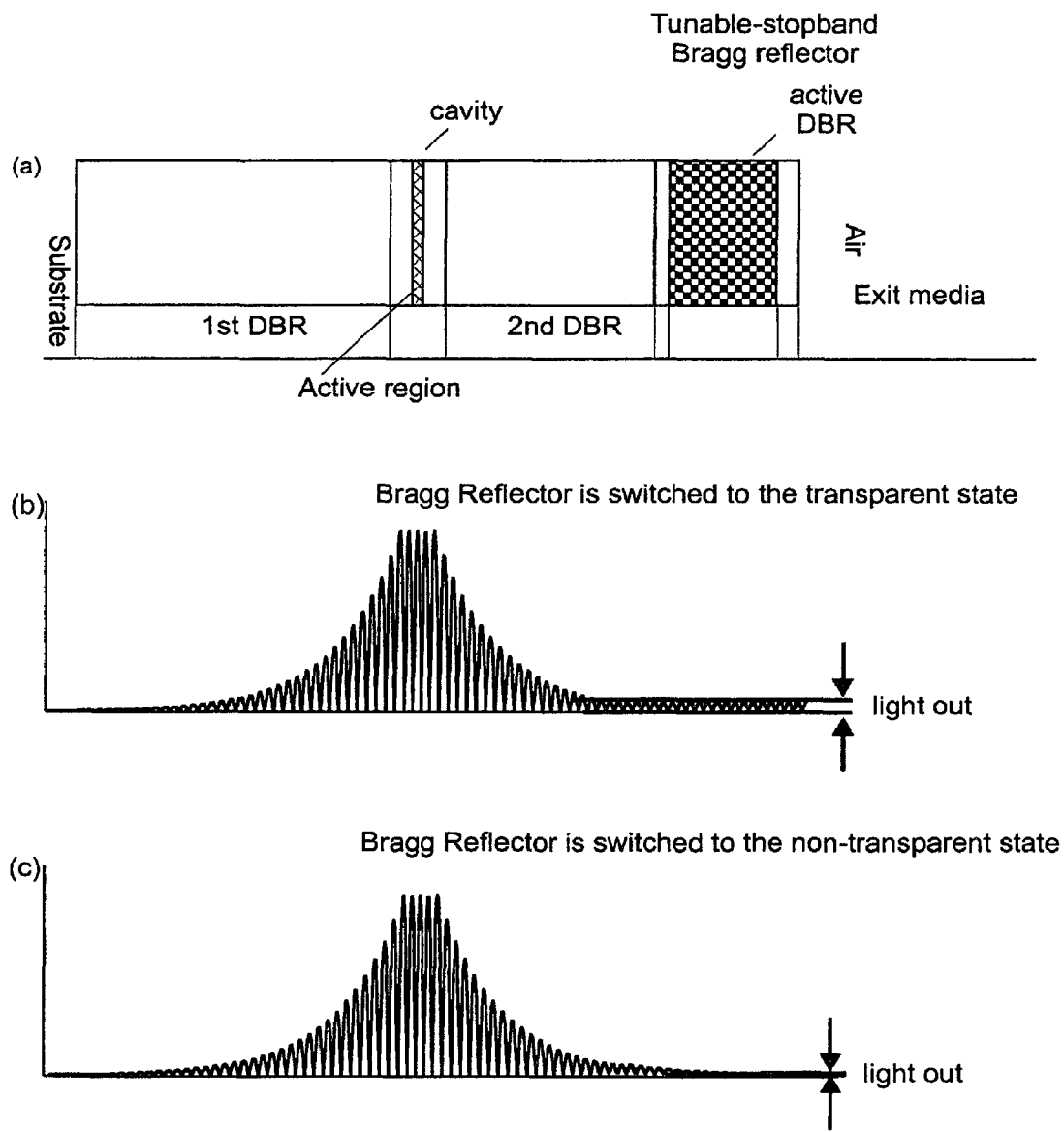
FIG. 7(a) shows a schematic diagram of the device of FIG. 4.
FIG. 7(b) shows a schematic diagram of the absolute value of the electric field strength profile of the laser optical mode of the device of FIG. 4 where the modulator is in the state ensuring low reflectivity of the stopband edge of the multilayer interference reflector.
FIG. 7(c) shows a schematic diagram of the absolute value of the electric field strength profile of the laser optical mode of the device of FIG. 4 where the modulator is in the state ensuring high reflectivity of the stopband edge of the multilayer interference reflector.

FIG. 7(a) shows schematic diagram of the device of FIG. 4 in a simple form, showing only some of the elements. The elements shown include the substrate, the first distributed Bragg reflector, the first cavity (which includes the active region), the second distributed Bragg reflector and the third "modulator" distributed Bragg reflector (which includes the modulator elements) and the contact region or a fourth distributed Bragg reflector.

FIG. 7(b) shows the spatial profile of the resonant optical mode of the device when the modulator is switched to the state, when the DBR reflectivity stopband does not overlap with the lasing wavelength. FIG. 7(b) plots the absolute value of the electric field strength in the optical mode. As there is no attenuation of the optical wave in the modulator DBR the field intensity does not change significantly in this region. Consequently, the light output power proportional to the field intensity in the air is high.

FIG. 7(c) shows the spatial profile of the resonant optical mode of the device when the modulator is switched to a reflecting, or non-transparent state. FIG. 7(c) plots the absolute value of the electric field strength in the optical mode. In the reflecting DBR state, the laser generates the laser light at any wavelength that does not correspond to the transparency regime of the DBR. Therefore, the optical mode of the laser will decay in the DBR. Consequently, the light output power proportional to the field intensity in the air is low.

By alternating a bias voltage applied to the modulator, one switches the device between the transparent state and non-transparent state. As the stopband edge can be made arbitrarily abrupt, a significant modulation depth can be realized. An additional advantage is the fact that for high-order transverse optical modes, having a shorter wavelength than the fundamental optical mode, the stopband edge wavelength is also shifted to shorter wavelengths enabling robust operation also for multimode devices. The output light power alternates between a high intensity and a low intensity accordingly.

Figure 8:
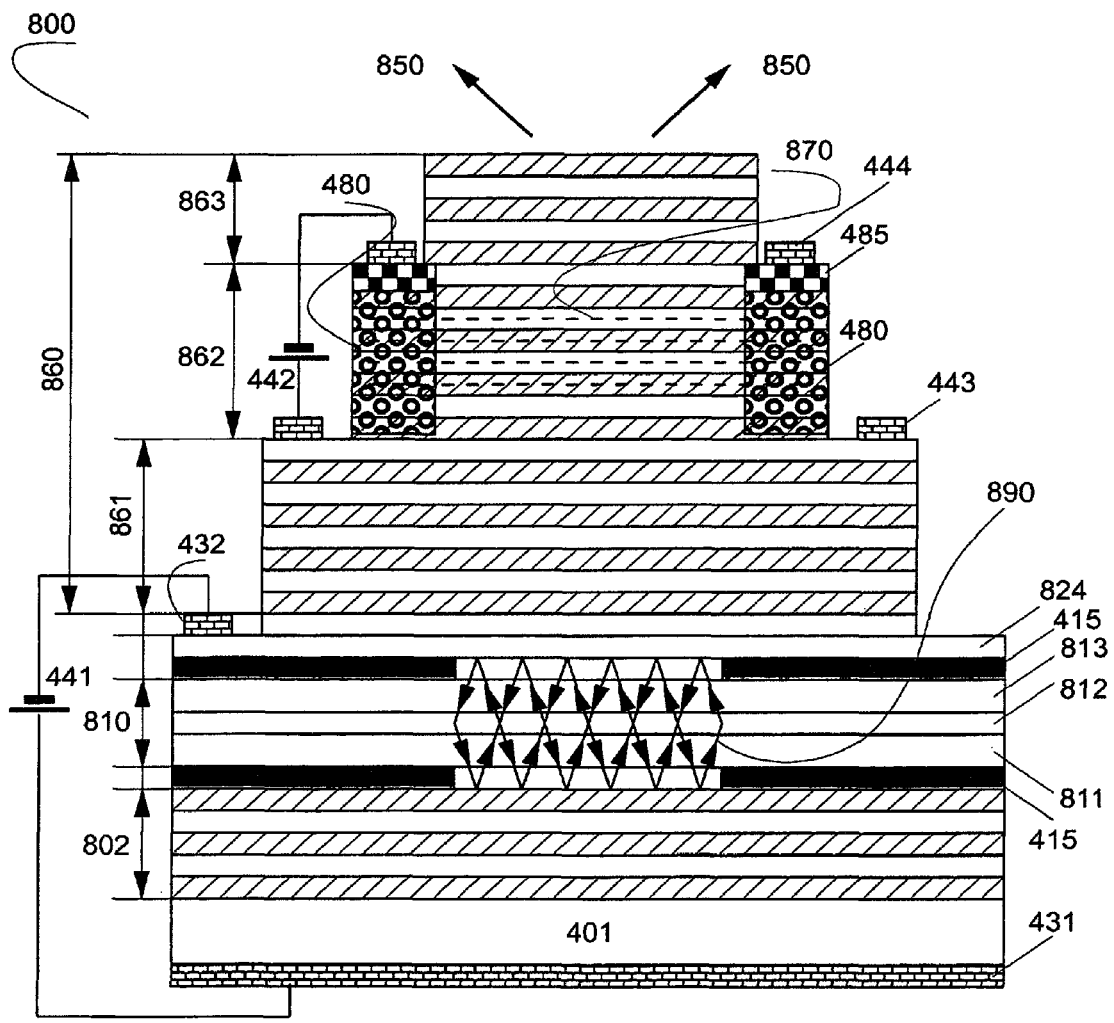
FIG. 8 shows a schematic diagram of an intensity modulated tilted cavity surface-emitting laser including a light generating element and a tunable stopband multilayer interference reflector element, where a modulator is placed in the multilayer interference reflector element.

In a similar way, a tunable tilted cavity laser can be constructed. FIG. 8 shows an electrooptically modulated tilted cavity surface-emitting laser (800). The concept of a tilted cavity laser was proposed by N. N. Ledentsov et al. in an earlier patent application, N. N. Ledentsov and V. A. Shchukin, "Tilted Cavity Semiconductor Laser and Method o Making Same", US patent Application No. 2003/0152120 A1. A tilted cavity laser comprises a cavity and at least one multilayer interference reflector (MIR), where the cavity and the at least one multilayer interference reflector are selected such, that optical mode, having the minimum leakage losses to the substrate and the contact layers is an optical mode, in which the light within the cavity propagates in a direction tilted with respect to both the p-n junction plane and the direction normal to the p-n junction plane.

Electooptically tunable tilted cavity surface-emitting laser (800) is grown epitaxially on a substrate (401) which is preferably p-doped. The device comprises a first multilayer interference reflector, MIR, (802), which is preferably p-doped, the light generating element (810), and a second, or top MIR (860). The top MIR (860) preferably comprises a first part (861), which is preferably n-doped, a second part (862), which is preferably undoped, and a third part (863), which is preferably p-doped. The light generating element (810) preferably includes a weakly p-doped or an undoped layer (811), an active region (812), a weakly n-doped or an undoped layer (813).

The active region (412) is formed of any insertion or combinations of insertions, including a double heterostructure, a quantum well, an array of quantum wires, and arrays of quantum dots, or any combination thereof. The active region generates light, when a forward bias (441) is applied via the p-contact (431) and the n-contact (432). In this embodiment, a current spreading n-layer is formed (824) between the light generating element (810) and the top MIR (860). The second part (862) of the top DBR operates as a modulator element. A reverse bias (442) is applied to the undoped part of the DBR via the n-contact (443) and the p-contact (444). The modulator element preferably includes a single or multiple quantum insertions (870), which can be a single or multiple quantum wells, a single or multiple layers of quantum wires, a single or multiple layers of quantum dots, or any combination thereof.

In order to provide high-frequency operation of the device (800), certain measures are preferably undertaken to reduce parasitic capacitance of the modulator region. The region underneath the n-contact (444) is preferably subject to proton bombardment, which results in the formation of a region (480) with a high concentration of defects and low conductivity. Thus, the region (480) formed of initially n-doped or p-doped regions, will behave as a region of intrinsic, i.e. semi-insulating semiconductor. In order to provide a possibility to apply the bias (442) to the quantum insertions (870) within the modulator element, diffusion of Zn is preferably performed to the region (485) underneath the p-contact (444).

Due to the diffusion of Zn, a part of semi-insulating region transforms in a p-doped highly conducting region, allowing to apply bias from the p-contact (444) to the quantum insertions (470).

The light generating element (810) forms a tilted cavity. The tilted cavity, the first MIR (802), and the second MIR (860) are selected such, that among various optical modes, a mode having the minimum leaky losses to the substrate and the contacts is a tilted optical mode (890), in which light within the cavity propagates in a direction tilted with respect to both the p-n junction plane and to the direction normal to the p-n junction plane. Light of the tilted optical mode (890) propagates through the second MIR (860), and comes out of the device as tilted light (850).

In one another embodiment of the present invention, light comes out of the electrooptically tunable tilted cavity surface-emitting laser as vertically propagating light.

Figure 9:
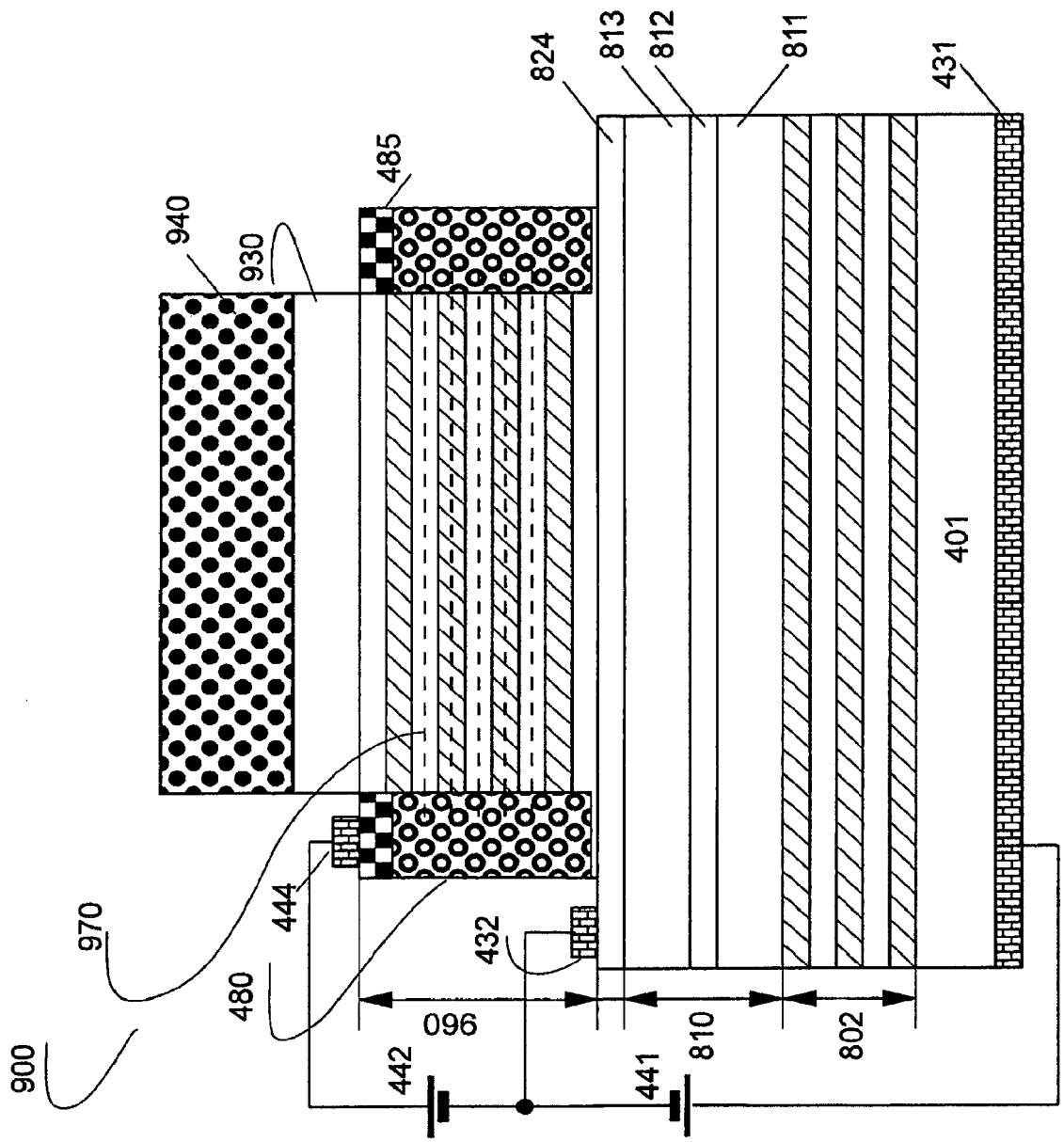
FIG. 9 shows a schematic diagram of a cross-sectional view of an electrooptically modulated edge-emitting laser including a light generating element and a stopband edge-modulated multilayer interference reflector element. Modulated absorption causes light intensity modulation in the exit waveguide.
Figure 10:
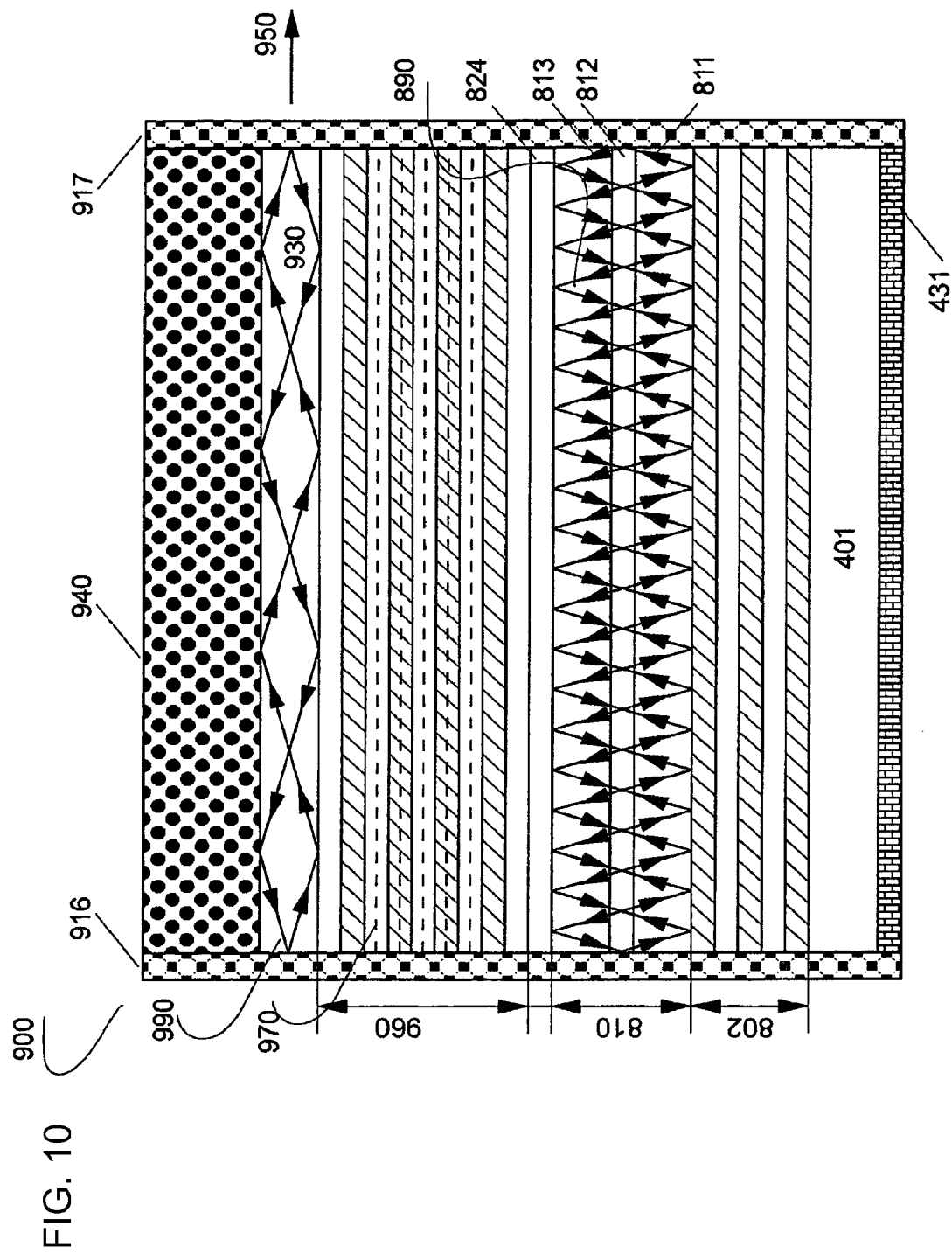
FIG. 10 shows a schematic diagram of a cross-sectional view of the device of FIG. 9 in the perpendicular cross section plane.

FIGS. 9 and 10 show an electronically intensity-modulated edge-emitting laser (900) in two mutually perpendicular cross-sectional planes. FIG. 9 shows a cross section in the vertical transverse plane, which is perpendicular to the direction of the propagation of laser light in the edge emitter. FIG. 10 shows a cross section in the vertical longitudinal plane, parallel to the direction of propagation of the laser light in the edge emitter. An active cavity (810), a first MIR (802), and a second top MIR (960) are selected such that only one tilted optical mode (890) has a high optical confinement factor in the active region (812) and low loss. The active cavity (810) is coupled to the exit waveguide (930) via the top MIR (960). The exit waveguide (930) is bounded by the second MIR (960) and the third reflector (940) which is preferably an evanescent reflector. Due to different refractive indices of the active cavity (810) and exit waveguide (930), the single combined optical mode has different effective mode angles in the active cavity and in the exit waveguide. This is illustrated schematically as different tilt directions of the optical mode (990) in the exit waveguide and (930) in the active cavity. Thus, the light can exit the waveguide (930) avoiding the effect of the total internal reflection on the side facets of the laser. Applying the bias (442) to the second MIR (960) results in the applying electric field to the quantum insertions (970). This leads to a change of the refractive indices of the insertions and, thus, may enhance or reduce penetration of the laser light to the exit waveguide (930) and, thus, enhance or reduce the intensity of the emitted laser light (950). In a preferred embodiment, a highly reflecting coat (916) is mounted on a rear facet, and an antireflecting coat (917) is mounted on a front facet such that laser light exits the exit waveguide only through the front facet.

In one another embodiment of the present invention, a distributed feedback laser is fabricated, e.g. by introducing a grating in the exit waveguide (930), in order to provide wavelength-stabilized operation of the device.

Electronically intensity-modulated light-emitting diode can be realized in a similar approach as yet another embodiment of the present invention.

Figure 11:
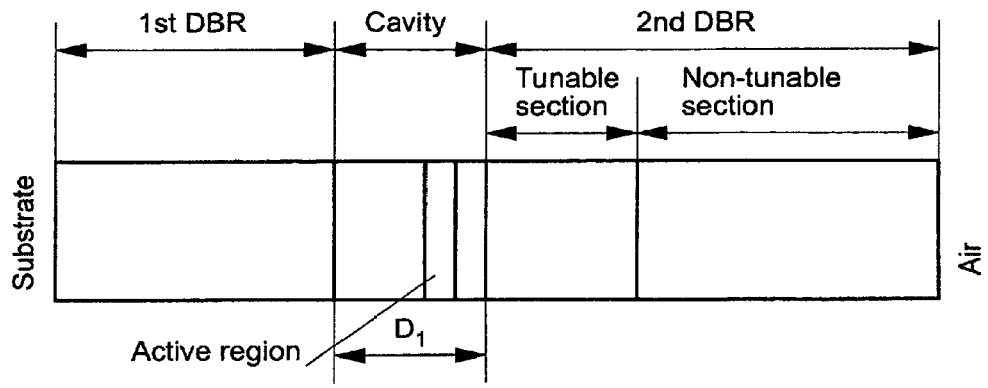
FIG. 11 shows schematically the principle of the wavelength tuning in the electrooptically Bragg-reflector stopband tunable vertical cavity surface-emitting laser of the present invention.
Figure 11:
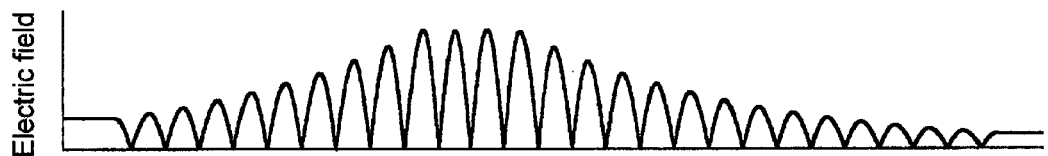
Figure 11:
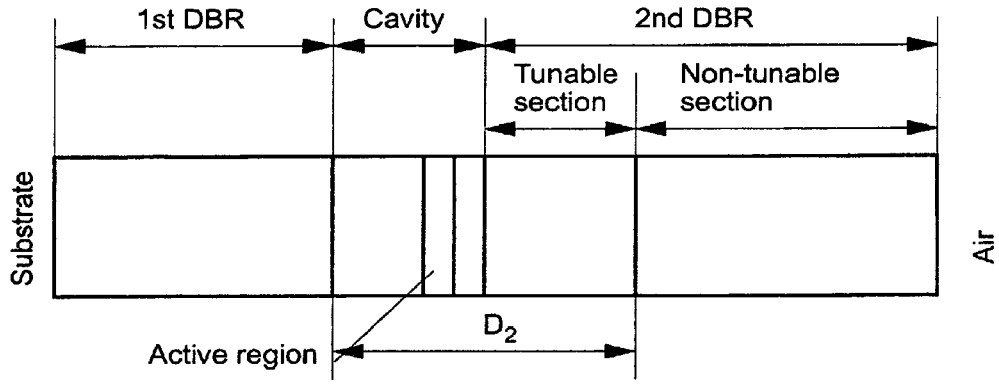
Figure 11:
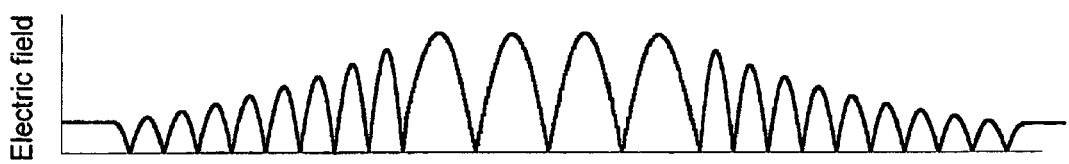

FIG. 11 illustrates schematically a possibility to fabricate a wavelength-tunable laser based on an electrooptically modulated distributed Bragg reflector. FIG. 11($a$) shows schematically main elements of a laser, namely, a first DBR, a cavity with the active region, and a second DBR consisting of a tunable section and a non-tunable section. If the second DBR is switched to a non-transparent state, the wavelength of the emitted laser light is determined by the thickness of the cavity $D_1$. FIG. 11($b$) illustrates the spatial profile of the resonant optical mode, namely the absolute value of the electric field strength.

FIG. 11(c) shows schematically the same device when the second DBR is switched to a transparent state. Then the tunable section of the DBR is transparent and may be qualitatively considered as a part of the cavity. Thus, the device contains an effective cavity with a thickness $D_2>D_1$, and wavelength of the laser light will be determined by a modified effective thickness of the cavity. FIG. 11(d) shows schematically the spatial profile of the resonant optical mode, namely the absolute value of the electric field strength.

When the device modulates the wavelength of the emitted laser light, it is preferred to separate the modulation of the wavelength and the modulation of the intensity, and to avoid the latter. Therefore, for the device of the embodiment schematically illustrated in FIG. 11, it is preferred to choose the first DBR weaker than the second DBR in the transparent state such that the main output of light will occur through the first DBR and the substrate. As the first DBR is not changed when the transparency of the second DBR is modulated, the intensity of the emitted laser light will not be changed. Different positioning of the sections with respect to the substrate are possible and, consequently, both top emitting and bottom emitting devices can be realized.

Similar approach can be used for a wavelength-tunable resonant cavity light-emitting diode as one another embodiment of the present invention.

Figure 12:
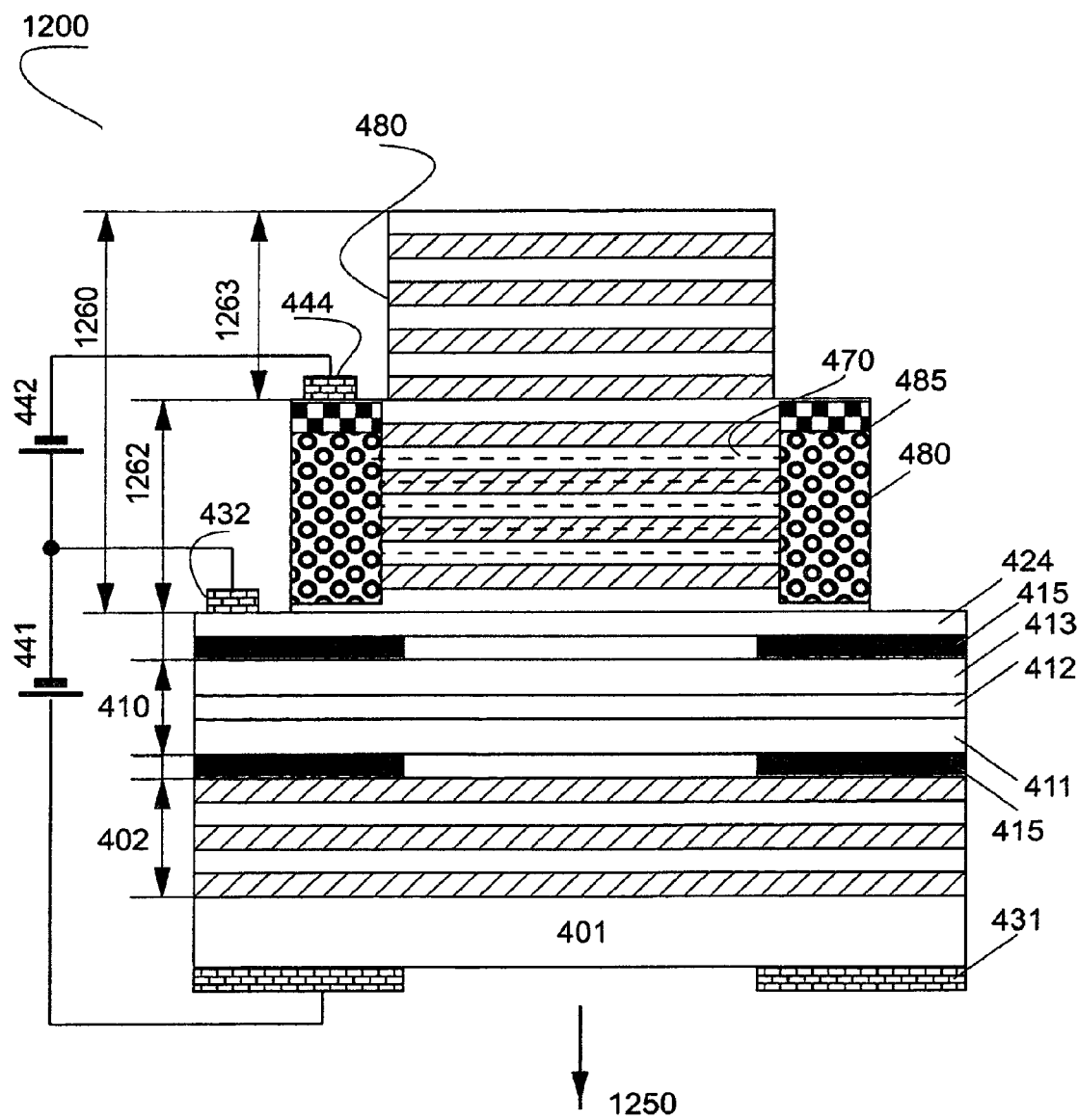
FIG. 12 shows schematically the electrooptically wavelength-modulated surface-emitting laser according to one of the embodiments of the present invention.

FIG. 12 illustrates schematically the electronically wavelength-tunable vertical cavity surface-emitting laser (1200), the operation of which is illustrated in FIG. 11. The second DBR (1262) comprises a tunable section (1262) and a non tunable section (1263). Applying bias (442) to the tunable section (1262) of the second DBR (1260), it is possible to tune the wavelength of the laser light (1250) emitted through the substrate.

Figure 13:
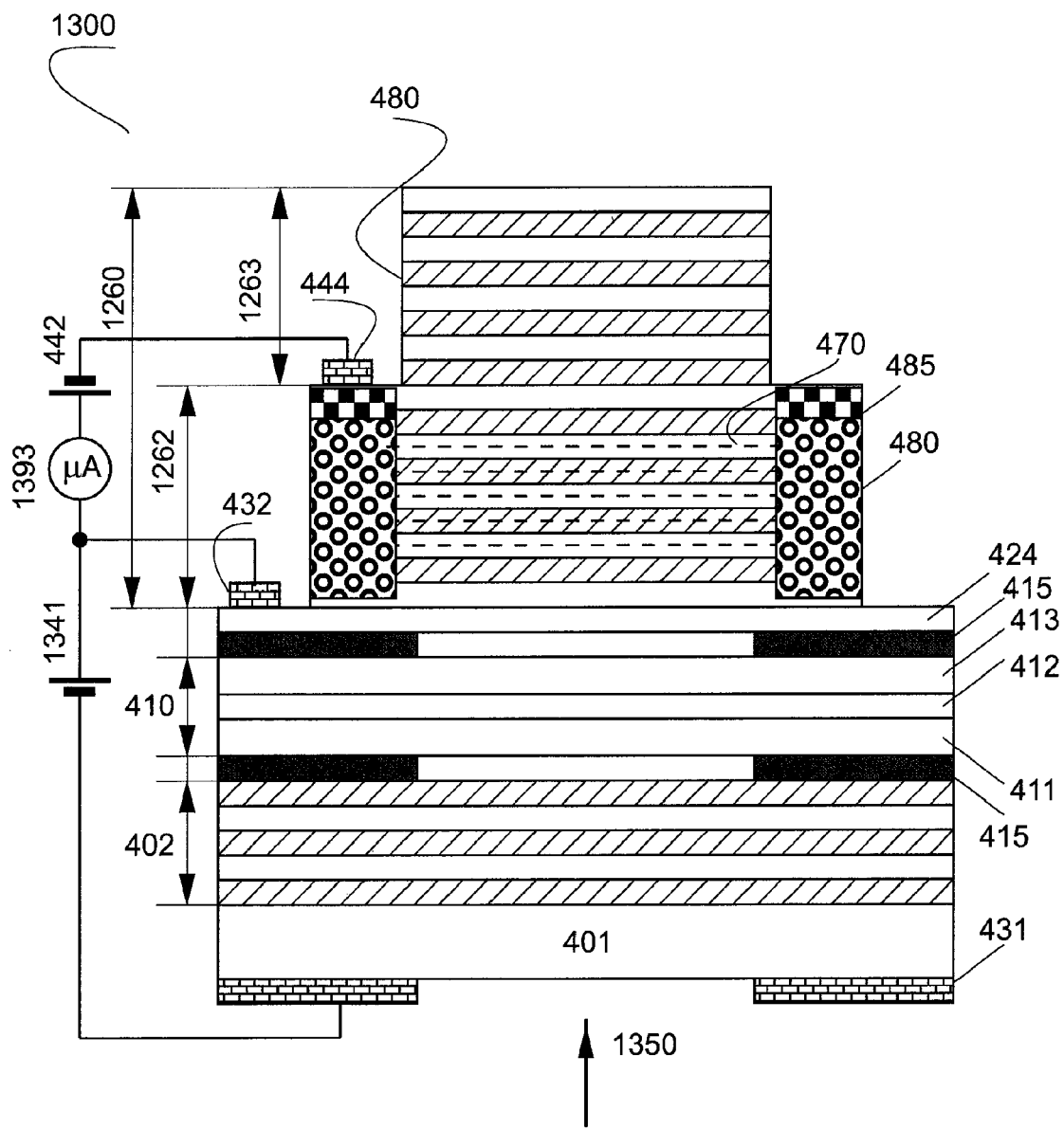
FIG. 13 shows schematically the electrooptically modulated resonant cavity photodetector according to one another embodiment of the present invention.

FIG. 13 illustrates schematically the electronically wavelength-tunable resonant cavity photodetector (1300). A zero or reverse bias (1341) is applied to the p-n junction in the active cavity (1310). External light (1350) impinging on the device is absorbed by the p-n junction element (1312) resulting in the generation of electron-hole pairs, and, thus, in the generation of a photocurrent which can be measured by a microampermeter (1393).

Figure 14:
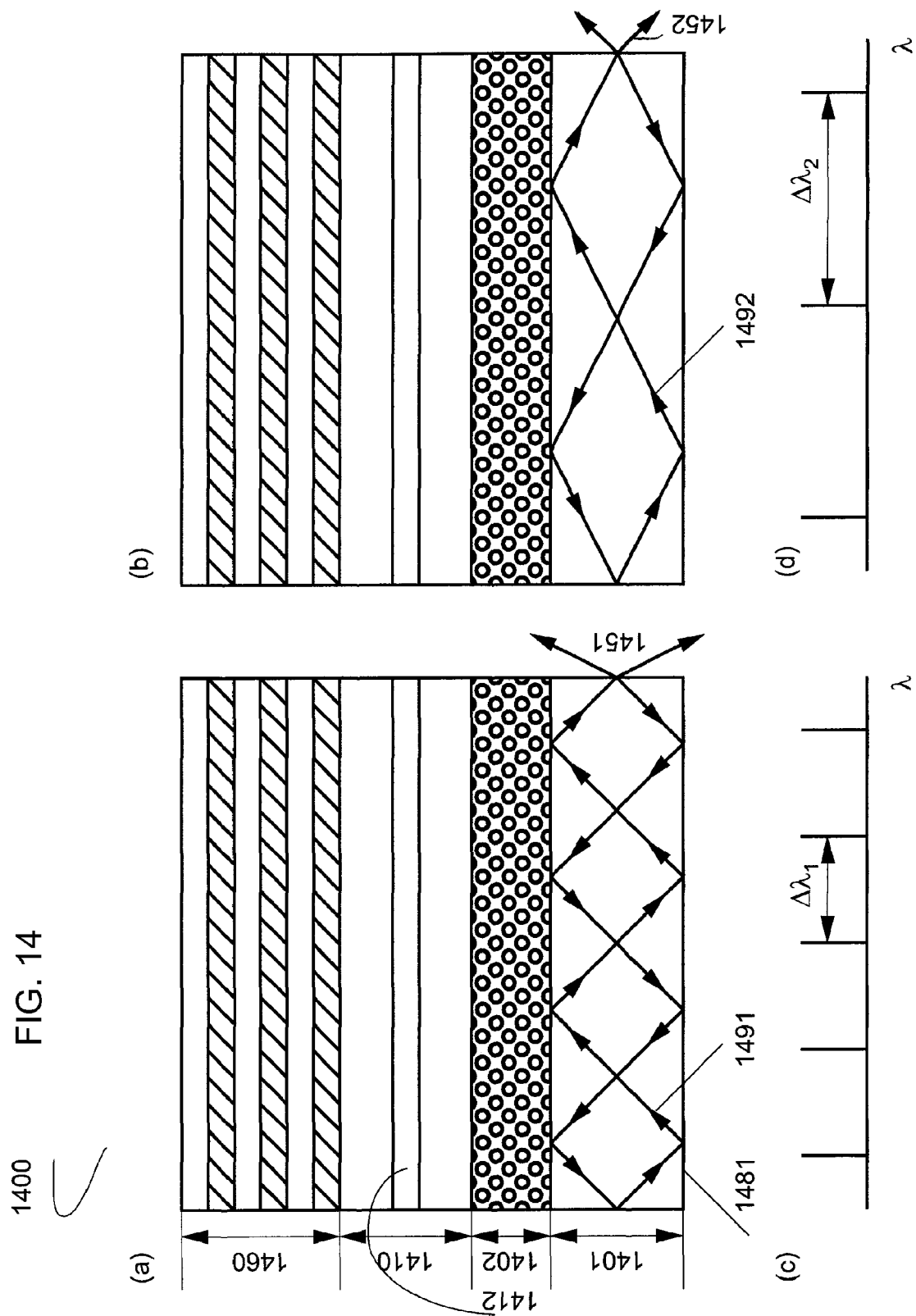
FIG. 14(a) shows schematically the electrooptically modulated leaky edge-emitting laser according to yet another embodiment of the present invention, wherein the multilayer interference reflector is switched to a transparent state.
FIG. 14(b) shows schematically the electrooptically modulated leaky edge-emitting laser according to yet another embodiment of the present invention, wherein the multilayer interference reflector is switched to a non-transparent state.
FIG. 14(c) shows the spectrum of the allowed optical modes of the electrooptically modulated leaky edge-emitting laser in the state shown in FIG. 14(a)
FIG. 14(d) shows the spectrum of the allowed optical modes of the electrooptically modulated leaky edge-emitting laser in the state shown in FIG. 14(b).

FIG. 14 illustrates a Bragg-reflector stopband-tunable leaky laser. FIG. 14(a) shows a leaky laser (1400) comprising an active waveguide (1410) with an active region (1412) sandwiched between the bottom reflector (1402) which is preferably an evanescent reflector, or a cladding layer, and a tunable multilayer interference reflector (1460). The laser generates light in a leaky optical mode which leaks into the substrate (1401), is reflected back from the back side of the substrate (1481) forming a tilted optical mode (1491) within the substrate. The light exits the device (1451) forming preferably a two-lobe beam. Necessary conditions for lasing require constructive interference of the laser light propagating from the active region through the substrate to the back surface of the substrate and back to the active region. These conditions are met for certain wavelengths shown schematically as peaks in FIG. 14(c). The spectral interval between the peaks is a function of the leaky angle. By varying the refractive index in the layers of the MIR (1460), the reflectivity of the MIR changes. This changes the leaky angle. FIG. 14(b) shows the state of the device with a smaller leaky angle showing the optical mode in the substrate (1492), the emitted light (1452) for this case, and the spectrum of the allowed optical modes (FIG. 14(d)). In a preferred embodiment, reduction of the transparency of the MIR (1460) results in a weaker confinement of the optical mode in the active waveguide (1410), and thus, in a larger leaky angle. Thus, FIGS. 14(a) and 14(c) correspond to a non-transparent state of the MIR (1460), and FIGS. 14(b) and 14(d) correspond to a transparent state of the MIR.

Bragg-reflector stopband-tunable leaky light-emitting diode can be realized in a similar way as one another embodiment of the present invention.

When any optoelectronic device of the present invention allowing the intensity modulation of the emitted light is fabricated, it is possible to control the intensity of the emitted light. A method of the control includes two stages: calibration and control itself.

A method of calibrating the device consists of the following steps:

a) introducing a microampermeter in the same electrical circuit, where the bias is applied to the modulator region, wherein the microampermeter is capable to measure the photocurrent generated in the modulator upon an applied reverse bias;

b) applying a bias to the modulator region and to the light generating element independently with the electric contacts;

c) electrooptically tuning a stopband reflectivity edge wavelength of the multilayer interference reflector with respect to a resonant wavelength of the cavity;

d) varying an optical transmittance of the device, such that an output optical power is varied;

e) measuring the photocurrent in the electric circuit of the modulator section under reverse bias, and measuring the output light power of the device;

f) obtaining the light-photocurrent calibration curves.

Once the device is calibrated, a method of controlling the output power may be used, wherein the method consists of the steps of:

a) applying a bias to the modulator region and to the light generating element independently with the electric contacts;

b) electrooptically tuning a stopband reflectivity edge wavelength of the multilayer interference reflector with respect to a resonant wavelength of the cavity;

c) varying an optical transmittance of the device, such that an output optical power is varied;

d) measuring the photocurrent in the electric circuit of the modulator section under reverse bias; and e) adjusting the drive current in the circuit of the active element to keep the requested output power of the device using the calibrated light-photocurrent curves.

A lot of modifications can be made. Photonic crystals can be used for better mode control and light extraction efficiency. The surface-emitting devices operating at high angles with respect to normal can be constructed. Different designs of multilayer interference reflectors used as Bragg reflectors can be applied. Multiple sections can be introduced. Photocurrent of the modulator section can be used for failure control or for power adjustment.

Certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

The invention claimed is:

1. A monolithic semiconductor optoelectronic device comprising:
   a) at least one cavity region having at least one resonant wavelength, called a first wavelength;
   b) at least one light generating element comprising a gain region formed with a planar p-n junction, the light generating element being configured to generate light when a forward bias is applied to the gain region;
   c) at least one multilayer interference reflector having an optical power transmittance, said at least one multilayer interference reflector being formed of alternating layers, with an alternation of layers being realized in a direction perpendicular to said planar p-n junction;
   d) at least one non-tunable part of the multilayer interference reflector;
   e) at least one modulator region formed by a part of the multilayer interference reflector, having an optical power reflectance, a reflectivity stopband, and a reflectivity stopband edge at a second wavelength, wherein the modulator region is configured to modulate an output intensity of the light by electro-optically tuning said second wavelength such that said second wavelength is shifted from a spectral position on a short wavelength side from said first wavelength to a spectral position on a long wavelength side from said first wavelength, wherein the multilayer interference reflector is changed from the non-transparent state to the transparent state or vice versa by the tuning, wherein the tuning varies the optical power transmittance of the multilayer interference reflector at said first wavelength; and
   f) at least three electric contacts configured to apply bias to the modulator region and to the light generating element independently;
   wherein said at least one light generating element is positioned within an optical field profile and said at least one modulator region is positioned within the optical field profile.

2. The semiconductor optoelectronic device of claim 1, wherein the modulator region is configured to tune said second wavelength with respect to said first wavelength such that the multilayer interference reflector is tuned between the non-transparent state and the transparent state using a quantum confined Stark effect by applying a reverse bias to tune a component of a refractive index of the modulator region.

3. The semiconductor optoelectronic device of claim 1, wherein the modulator region is configured to tune said second wavelength with respect to said first wavelength such that the multilayer interference reflector is tuned between the non-transparent state and the transparent state using an exciton bleaching effect by injection of non-equilibrium carriers by applying a forward bias.

4. The semiconductor optoelectronic device of claim 1, wherein the modulator region is configured to tune said second wavelength with respect to said first wavelength such that the multilayer interference reflector is tuned between the non-transparent state and the transparent state via an injection of electron-hole plasma by applying a forward bias, and wherein the modulator region is undoped.

5. The semiconductor optoelectronic device of claim 1, wherein the modulator region has a refractive index and modulating the refractive index shifts said second wavelength with respect to said first wavelength such that the multilayer interference reflector is tuned between the non-transparent state and the transparent state and such that an output optical power is modulated.

6. The semiconductor optoelectronic device of claim 1, wherein the gain region is configured to realize a population inversion such that the gain overcomes the overall losses enabling lasing.

7. The semiconductor optoelectronic device of claim 6, wherein the device is selected from the group consisting of:
   a) a vertical cavity surface-emitting laser;
   b) an edge-emitting laser;
   c) a distributed feedback edge-emitting laser;
   d) a multi-section edge-emitting laser;
   e) a tilted cavity laser; and
   f) a light-emitting diode.

8. The semiconductor optoelectronic device of claim 1, wherein the device modulates a transmittance of light through a filter comprising at least one cavity and a multilayer interference reflector by modulating the second wavelength of the reflectivity stopband edge of said modulator region.

9. The semiconductor optoelectronic device of claim 1, wherein at least one element of the device is formed of materials selected from the group consisting of:
   i) III-V semiconductor materials; and
   ii) alloys based on III-V semiconductor materials;
   wherein the III-V semiconductor materials are selected from the group of binary compounds of an element A, selected from the group consisting of Al, Ga, and In; and an element B, selected from the group consisting of N, P, As, and Sb.

10. The semiconductor optoelectronic device of claim 1, wherein the light generated by the light generating element has a wavelength that is not within the reflectivity stopband of the modulator.

11. The semiconductor optoelectronic device of claim 1, wherein the cavity region, the multilayer interference reflector, the light generating element, the modulator region, and the contacts form a monolithic structure.

12. A method of controlling an intensity of laser light-emitting from a monolithic semiconductor optoelectronic device comprising at least one resonant cavity having at least one resonant wavelength, called a first wavelength, at least one light generating element comprising a gain region formed with a planar p-n junction, the light generating element being configured to generate light when a forward bias is applied to the gain region, at least one multilayer interference reflector having an optical power transmittance, said at least one multilayer interference reflector being formed of alternating layers, with an alternation of layers being realized in a direction perpendicular to said planar p-n junction, at least one non-tunable part of the modulator interference reflector, at least one modulator region formed by a part of said multilayer interference reflector, and at least three electric contacts configured to apply bias to the modulator region and to the light generating element independently, wherein said modulator region has an optical power reflectance, a reflectivity stopband and a reflectivity stopband edge at a second wavelength, wherein the modulator region is configured to modulate an output intensity of the light by electro-optically tuning the second wavelength such that the second wavelength is shifted from a spectral position on a short wavelength side from the first wavelength to a spectral position on a long wavelength side from the first wavelength, wherein the multilayer interference reflector is changed from the non-transparent state to the transparent state or vice versa by the tuning, wherein the tuning varies the optical power transmittance of the multilayer interference reflector at the first wavelength, and wherein the at least one light generating element is positioned within an optical field profile and the at least one modulator region is positioned within the optical field profile;

the method comprising the stages of:
a) calibration,
wherein the calibration further comprises the steps of:
i) introducing a microampermeter in an electrical circuit including the monolithic semiconductor optoelectronic device, where the bias is applied to the modulator region, wherein the microampermeter is capable to measure the photocurrent generated in the modulator upon an applied reverse bias;
ii) applying a bias to the modulator region and to the light generating element independently with the electric contacts;
iii) electrooptically tuning the second wavelength with respect to the first wavelength;
iv) varying an optical transmittance of the multilayer interference reflector, such that an output optical power is varied;
v) measuring the photocurrent in the electric circuit of the modulator section under reverse bias, and measuring the output light power of the device;
vi) obtaining the light-photocurrent calibration curves: and
b) control itself,
wherein this stage further comprises the steps of:
i) applying a bias to the modulator region and to the light generating element independently with the electric contacts;
ii) electrooptically tuning the second wavelength with respect to the first wavelength;
iii) varying an optical transmittance of the multilayer interference reflector, such that an output optical power is varied;
iv) measuring the photocurrent in the electric circuit of the modulator section under reverse bias; and
v) adjusting the drive current in the circuit of the active element to keep the requested output power of the device using the calibrated light-photocurrent curves.

13. The method of claim 12, wherein the light generated by the light generating element has a wavelength that is not within the reflectivity stopband of the modulator.

14. The method of claim 12, which further comprises providing the semiconductor optoelectronic device as a monolithic structure.

15. A monolithic semiconductor resonant cavity photodetector, comprising:
a) at least one resonant cavity having at least one resonant wavelength, called a first wavelength;
b) at least one light absorbing element comprising a planar p-n junction, the light absorbing element being configured to absorb light and generate a photocurrent when a zero or a negative bias is applied to the light absorbing element;
c) at least one multilayer interference reflector having an optical power transmittance, said at least one multilayer interference reflector being formed of alternating layers, with an alternation of layers being realized in a direction perpendicular to said planar p-n junction;
d) at least one non-tunable part of the multilayer interference reflector;
e) at least one modulator region formed by a part of the multilayer interference reflector, having an optical power reflectance, a reflectivity stopband, and a reflectivity stopband edge at a second wavelength, wherein the modulator region is configured to modulate the transmittance of the multilayer interference reflector by electro-optically tuning said second wavelength such that said second wavelength is shifted from a spectral position on a short wavelength side from said first wavelength to a spectral position on a long wavelength side from said first wavelength, wherein the multilayer interference reflector is changed from the non-transparent state to the transparent state or vice versa, wherein the tuning varies the optical transmittance of the multilayer interference reflector at said first wavelength; and
f) at least three electric contacts which apply bias to the modulator region and to the light absorbing element independently;
wherein said at least one light generating element is positioned within an optical field profile and said at least one modulator region is positioned within the optical field profile.

16. The semiconductor optoelectronic device of claim 15, wherein the resonant cavity, the multilayer interference reflector, the modulator region, the light absorbing element and the contacts form a monolithic structure.

* * * * *